(12) United States Patent
Yeke Yazdandoost et al.

(10) Patent No.: US 11,073,712 B2
(45) Date of Patent: Jul. 27, 2021

(54) ELECTRONIC DEVICE DISPLAY FOR THROUGH-DISPLAY IMAGING

(71) Applicant: Apple Inc., Cupertino, CA (US)

(72) Inventors: Mohammad Yeke Yazdandoost, San Jose, CA (US); Giovanni Gozzini, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/949,681

(22) Filed: Apr. 10, 2018

(65) Prior Publication Data
US 2019/0310724 A1   Oct. 10, 2019

(51) Int. Cl.
*G02F 1/1333* (2006.01)
*G06F 3/041* (2006.01)
(Continued)

(52) U.S. Cl.
CPC ...... *G02F 1/13338* (2013.01); *G02F 1/13318* (2013.01); *G06F 3/042* (2013.01); *G06F 3/0412* (2013.01); *G06K 9/0004* (2013.01); *H01L 27/323* (2013.01); *H01L 27/3211* (2013.01); *H01L 27/3216* (2013.01); *H01L 27/3227* (2013.01); *H01L 27/3234* (2013.01); *H01L 51/524* (2013.01); *H01L 51/5253* (2013.01); *H01L 51/5271* (2013.01);
(Continued)

(58) Field of Classification Search
CPC ............. G02F 1/13338; G02F 1/13318; G06F 3/0412; G06F 3/042; G06F 1/1643; G06F 3/0421; H01L 51/5275; H01L 27/3234; H01L 27/3227; H01L 51/524; H01L 27/323; H01L 51/5253; H01L 27/3216; H01L 27/3211; H01L 51/5284; H01L 27/3276; H01L 27/326; G06K 9/0004
See application file for complete search history.

(56) References Cited

U.S. PATENT DOCUMENTS 7,349,574 B1   3/2008   Sodini et al.
8,111,306 B2   2/2012   Kuruma et al.
(Continued)

FOREIGN PATENT DOCUMENTS

CN   106104565   11/2016
CN   106298856    1/2017
(Continued)

OTHER PUBLICATIONS

U.S. Appl. No. 15/994,874, filed May 31, 2018, Lee et al.
(Continued)

*Primary Examiner* — David D Davis
(74) *Attorney, Agent, or Firm* — Brownstein Hyatt Farber Schreck, LLP

(57) ABSTRACT

Systems and methods for through-display imaging. A display includes an imaging aperture defined through an opaque backing. An optical imaging array is aligned with the aperture. Above the aperture, the display is arranged and/or configured for increased optical transmittance. For example, a region of the display above, or adjacent to, the imaging aperture can be formed with a lower pixel density than other regions of the display, thereby increasing inter-pixel distance (e.g., pitch) and increasing an area through which light can traverse the display to reach the optical imaging array.

22 Claims, 21 Drawing Sheets

(51) Int. Cl.
*G06F 3/042* (2006.01)
*H01L 51/52* (2006.01)
*H01L 27/32* (2006.01)
*G06K 9/00* (2006.01)
*G02F 1/133* (2006.01)
*G06F 1/16* (2006.01)

(52) U.S. Cl.
CPC ...... *H01L 51/5275* (2013.01); *H01L 51/5284* (2013.01); *G06F 1/1643* (2013.01); *H01L 27/3276* (2013.01)

(56) References Cited

U.S. PATENT DOCUMENTS

| | | | |
|---|---|---|---|
| 8,128,890 | B2 | 5/2012 | Droog |
| 8,792,020 | B2 | 7/2014 | Lee et al. |
| 8,957,358 | B2 | 2/2015 | Wan et al. |
| 8,975,752 | B2 | 3/2015 | Chow et al. |
| 9,312,294 | B2 | 4/2016 | Chuang et al. |
| 9,349,035 | B1* | 5/2016 | Gerber ............... G06K 9/00013 |
| 9,362,320 | B2 | 6/2016 | Yamashita et al. |
| 10,026,771 | B1 | 7/2018 | Lee et al. |
| 10,181,070 | B2 | 1/2019 | Smith et al. |
| 10,360,431 | B2 | 7/2019 | Gozzini et al. |
| 2002/0050958 | A1* | 5/2002 | Matthies ............... H01L 25/167 345/55 |
| 2005/0002448 | A1 | 1/2005 | Knight et al. |
| 2005/0174335 | A1* | 8/2005 | Kent ................... G06F 3/0412 345/173 |
| 2008/0054320 | A1 | 3/2008 | Solhusvik et al. |
| 2012/0262408 | A1* | 10/2012 | Pasquero ............. G06F 3/0412 345/174 |
| 2013/0127790 | A1* | 5/2013 | Wassvik .................. G06F 3/042 345/175 |
| 2014/0133715 | A1 | 5/2014 | Ballard et al. |
| 2015/0177884 | A1* | 6/2015 | Han ........................ G06F 3/044 345/174 |
| 2015/0177979 | A1* | 6/2015 | Johansson ............. G06F 3/0412 715/763 |
| 2015/0185983 | A1* | 7/2015 | Yang .................... G06F 3/03547 345/173 |
| 2016/0105621 | A1 | 4/2016 | McMahon et al. |
| 2016/0266688 | A1* | 9/2016 | Yang ....................... G06F 3/041 |
| 2017/0091506 | A1* | 3/2017 | Sinha .................... G06F 1/1643 |
| 2017/0220182 | A1* | 8/2017 | Schwartz ............. G06F 3/0416 |
| 2017/0276928 | A1* | 9/2017 | Sakai ..................... G02B 5/201 |
| 2017/0337413 | A1* | 11/2017 | Bhat .................... G06K 9/0002 |
| 2018/0081100 | A1 | 3/2018 | Wang et al. |
| 2018/0089485 | A1* | 3/2018 | Bok ...................... G06K 9/0002 |
| 2018/0089491 | A1* | 3/2018 | Kim ...................... G06F 3/0412 |
| 2018/0342544 | A1 | 11/2018 | Lee et al. |

FOREIGN PATENT DOCUMENTS

| | | |
|---|---|---|
| CN | 107870689 | 4/2018 |
| WO | WO 15/005959 | 1/2015 |
| WO | WO 18/040512 | 3/2018 |

OTHER PUBLICATIONS

Charlet et al., "Chip-to-chip interconnections based on the wireless capacitive coupling for 3D integration," Microelectronic Engineering, vol. 83, 2006, pp. 2195-2199.

* cited by examiner

500c

518

520

•~522

ELECTRONIC DEVICE DISPLAY FOR THROUGH-DISPLAY IMAGING

FIELD

Embodiments described herein relate to electronic device displays and, in particular, to display stack constructions defining imaging apertures through opaque layers and promoting increased inter-pixel optical transmittance to facilitate through-display imaging.

BACKGROUND

An electronic device display (a "display") is typically formed from a stack of functional and structural layers (a "display stack") that is attached to, or otherwise disposed below, a protective cover. In many conventional implementations, the protective cover defines an exterior surface of a housing of an electronic device that incorporates the display. For increased contrast, a conventional display stack is intentionally designed to be opaque.

An electronic device can also include an imaging sensor, such as a camera or an ambient light sensor. Typically, an imaging sensor is positioned below the protective cover, adjacent to the display stack. As such, a conventional electronic device incorporating both a display stack and an imaging sensor typically requires a large-area protective cover that extends beyond the periphery of the display stack in order to reserve space to accommodate the imaging sensor. This conventional construction undesirably increases the apparent size of a bezel region circumscribing the display, while also undesirably increasing the size and volume of the housing of the electronic device.

SUMMARY

Embodiments described herein generally reference electronic devices including a display stack that forms a display. The display defines an active display area that, in turn, defines at least two discrete pixel regions: a first pixel region and a second pixel region. In many embodiments, the first pixel region has a first pixel density and the second pixel region has a second pixel density. The second pixel region can be entirely inset within the first pixel region, but this may not be required. The second pixel density is typically less than the first pixel density, but this may not be required. In one example, the second pixel density is a factor of two lower than the first pixel density.

The display stack also includes a backing that is typically opaque. The opaque backing is positioned below the display and defines an aperture below the second pixel region. In some cases, the aperture can be filled with an optically-transparent material such as an optically clear adhesive. In some examples, the optically-transparent material has a refractive index approximately equivalent to one or more layers of the display stack.

The display also includes an optical imaging array positioned below the aperture. The optical imaging array is configured to receive light transmitted through one or more inter-pixel sub-regions of the second pixel region. An inter-pixel region is typically defined between at least two pixels (e.g., two or more pixels).

In some embodiments, the optical imaging array is configured to receive light emitted from the display that is subsequently reflected from a touch input provided above the second pixel region. Data received from each imaging sensor of the optical imaging array can be aggregated into an image or sequence of images that corresponds to surface features of the object or objects providing the touch input. In an example embodiment, the image(s) can be used to obtain a fingerprint image of a user touching the display. In another example embodiment, the image(s) can be used to detect a touch or force input to the display. In yet another example embodiment, the image(s) can be used to detect one or more biometric characteristics that change over time, such as a heart rate or a respiration rate of a user. The image(s)—or portions thereof—can be used for any suitable imaging or data aggregation purpose.

Other embodiments described herein generally reference another electronic device including a display stack that forms a display. In this embodiment, the display defines an active display area that, in turn, defines at least two discrete pixel regions: a first pixel region and a second pixel region. In these embodiments, the first pixel region and the second pixel region have different optical transmittance; typically the second pixel region has a higher optical transmittance than the first pixel region. As with other embodiments, an optical imaging array can be positioned behind the second pixel region.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1A:
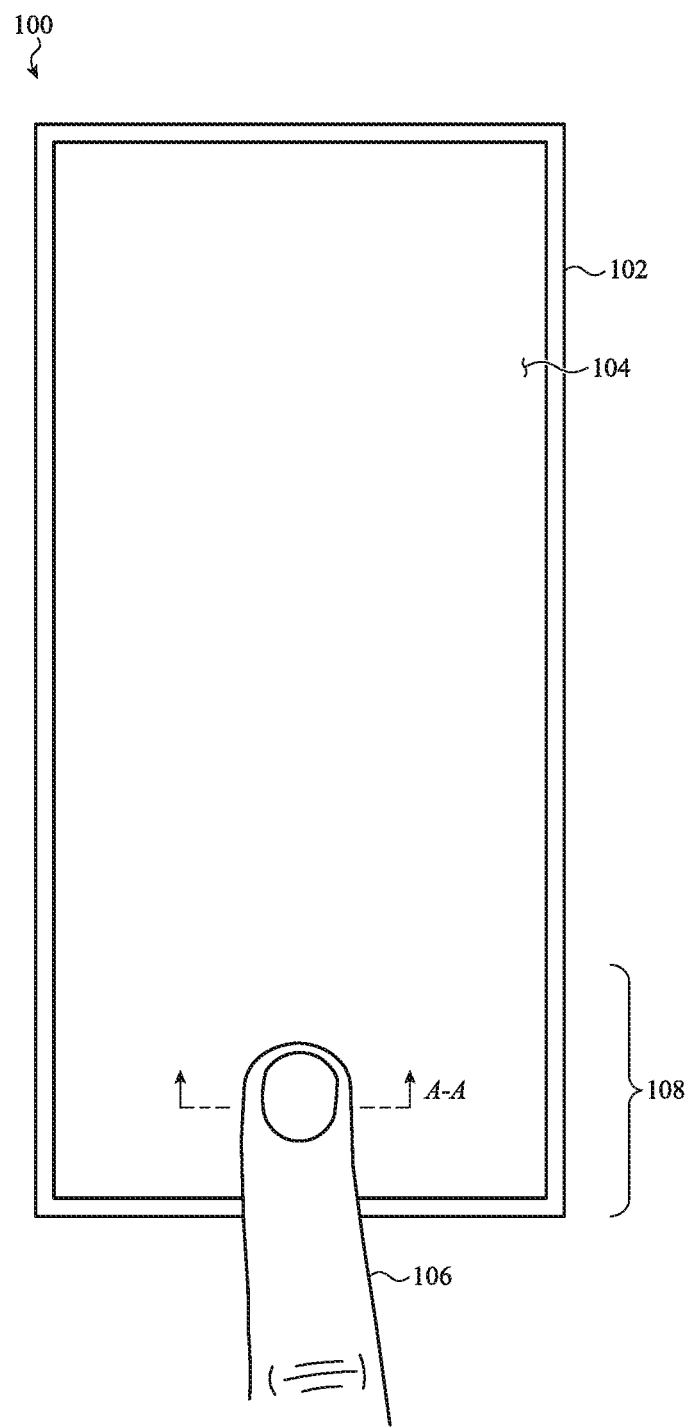
FIG. 1A depicts an electronic device that can incorporate a display stack suitable for through-display imaging.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein reference an electronic device that includes a display and an imaging sensor positioned behind the display. The display is constructed from a number of structural and functional layers collectively referred to as a "display stack." The imaging sensor can be any suitable imaging sensor, including both single-element imaging sensors (e.g., photodiodes, phototransistors, photosensitive elements, and so on) and multi-element imaging sensors (e.g., complementary metal oxide semiconductor arrays, photodiode arrays, and so on). For convenient reference, imaging sensors—however constructed or implemented—are referred to herein as "optical imaging arrays."

In many embodiments, an optical imaging array is positioned behind a display and is oriented to receive light transmitted through the display in a direction generally opposite that of light emitted from the display. The optical imaging array can be used by the electronic device for any suitable imaging, sensing, or data aggregation purpose including, but not limited to: ambient light sensing; proximity sensing; depth sensing; receiving structured light; optical communication; proximity sensing; biometric imaging (e.g., fingerprint imaging, iris imaging, facial recognition, and so on); and the like.

A display such as described herein can be associated with multiple discrete optical imaging arrays, distributed behind different regions of the display and/or configured for different purposes or in different ways, but for simplicity of description, many embodiments that follow reference a construction in which a single optical imaging array is positioned behind an active display area of a display of an electronic device. The embodiments described herein may be altered or adjusted to incorporate discreet optical imaging arrays in a variety of locations relative to a display or non-display surface of an electronic device.

In many embodiments, the optical imaging array is aligned with and optically coupled to an imaging aperture defined through one or more opaque or substantially opaque layers of the display stack such as, but not limited to: backing layers; support layers; reflector layers; backlights; and so on. As a result of this construction, light directed toward the display can pass through an imaging aperture and can be received and quantified by the optical imaging array.

Some embodiments described herein reference systems, architectures, constructions, techniques, and methods for increasing transmissivity of light (e.g., reducing absorption, reflection, refraction, diffraction, and/or diffusion) through the imaging aperture. In other cases, the imaging aperture can be positioned relative to, or otherwise associated with, one or more thinned portions of a display stack. These constructions increase the quantity of light received by the optical imaging array and, therefore, increase the quality, resolution, and/or signal-to-noise ratio of images or data generated by the optical imaging array.

Embodiments configured to increase transmissivity through a display stack include operations, techniques, and constructions such as, but not limited to: locally reducing pixel density of a display stack above an imaging aperture; locally altering a pixel or subpixel distribution pattern or arrangement above an imaging aperture; locally altering an electronic trace distribution (e.g., a thin-film transistor layer) or path above an imaging aperture; filtering light passing through an imaging aperture (e.g., collimating filters, infrared cut filters, narrow filed filters, polarizing filters, and so on); refracting or reflecting light passing through an imaging aperture (e.g., micro or macro lenses, beam-shaping, beam directing, and so on); and so on, or combinations thereof.

As a result of these and other constructions described herein, an optical imaging array positioned below an imaging aperture defined by a display stack can capture high-quality and high-resolution image data through a display of an electronic device while the display of that electronic device is generating one or more images. This technique is generally referred to herein as "through-display imaging." In these embodiments, the display of the electronic device appears to a user as a conventional display; no visual, tactile, or other indication of an optical imaging array is readily observed by a user of the electronic device.

As noted above, an electronic device can implement through-display imaging for any suitable imaging, sensing, data aggregation, or light capture purpose including, but not limited to: ambient light detection; ambient color temperature detection; picture or image capture; biometric imaging (e.g., fingerprint imaging, iris imaging, face recognition, and so on); optical device-to-device or network communication; receiving structure light reflections or transmissions; depth estimation or mapping; proximity sensing; touch sensing; and so on.

For simplicity of description, many embodiments that follow reference a construction in which an electronic device implements through-display imaging to capture one or more images of a fingerprint of a user touching a specified region (an "imaging region," above an imaging aperture) of the display of the electronic device, but this is not required of all embodiments. Through-display imaging can be implemented for any other purpose (or multiple purposes) described herein in any embodiment or implementation discussed herein. Multiple imaging regions (of the same or different size, shape, or imaging purpose) can be defined by a display or, alternatively, a single imaging region can be defined. In other cases, an entire display may be capable of through-display imaging.

These foregoing and other embodiments are discussed below with reference to FIGS. 1A-8. However, those skilled in the art will readily appreciate that the detailed description given herein with respect to these figures is for explanatory purposes only and should not be construed as limiting.

FIG. 1A depicts an electronic device 100, including a housing 102 that encloses a display stack defining a display. The display stack can include layers or elements such as, in no particular order: a touch input layer; a force input layer; an anode layer; a cathode layer; an organic layer; an encapsulation layer; a reflector layer; a stiffening layer; an injection layer; a transport layer; a polarizer layer; an anti-reflective layer; a liquid crystal layer; a backlight layer; one or more adhesive layers; a compressible layer; an ink layer; a mask layer; and so on.

For simplicity of description, the embodiments that follow reference an organic light-emitting diode display stack including, among other layers: a reflective backing layer; a thin-film transistor layer; an encapsulation layer; and an emitting layer. It is appreciated, however, that this is merely one illustrative example implementation and that other displays can be implemented with other display technologies, or combinations thereof.

The display stack also typically includes an input sensor (such as a force input sensor and/or a touch input sensor) to detect one or more characteristics of a user's physical interaction with an active display area 104 of the display of the electronic device 100. The active display area 104 is typically characterized by an arrangement of individually-controllable, physically-separated, and addressable pixels or subpixels distributed at one or more pixel densities. Example input characteristics that can be detected by an input sensor include, but are not limited to: touch location; force input location; touch gesture path, length, duration, and/or shape; force gesture path, length, duration and/or shape; magnitude of force input; number of simultaneous force inputs; number of simultaneous touch inputs; and so on. As a result of this construction, a user 106 of the electronic device 100 is encouraged to interact with content shown in the active display area 104 by physically touching and/or applying a force to the input surface above the active display area 104.

In these embodiments, the display stack is additionally configured to facilitate through-display imaging of the user's fingerprint when the user 106 touches the display to interact with content shown in the active display area 104.

More specifically, in one example, the display stack defines an imaging aperture (not shown) through a reflective backing layer of the display stack, thereby permitting light to travel through the display stack between two or more organic light-emitting diode subpixels or pixels (herein, "inter-pixel" regions). In some cases, the imaging aperture takes a rectangular shape and is disposed on a lower region of the active display area 104. In other cases, the imaging aperture takes a circular or oval shape and is disposed in a central region of the active display area 104. Typically, the imaging aperture is larger than the fingerprint of the user 106, but this may not be required and smaller apertures may be suitable.

As noted with respect to other embodiments described herein, the electronic device 100 also includes an optical imaging array (not shown). The optical imaging array is positioned below the imaging aperture in order to collect and quantify light directed through the inter-pixel regions of the display stack. As a result of this construction, the electronic device 100 can obtain an image of the fingerprint of the user 106; this operation is referred to herein as a "fingerprint imaging operation."

In some embodiments, the display of the electronic device 100 illuminates the finger of the user 106 during a fingerprint imaging operation. For example, in some embodiments, the display of the electronic device 100 illuminates a region of the display below the user's finger, as detected by the input sensor. In other examples, the display illuminates a perimeter of the user's finger. In some examples, the display of the electronic device 100 illuminates discrete portions of the user's finger in sequence or in a particular pattern.

Illumination of the user's finger during a fingerprint imaging operation can occur in a number of suitable ways. For example, in some cases, the display of the electronic device 100 illuminates the user's finger with pulsed (continuous or discrete) or steady white light. In another example, the display of the electronic device 100 illuminates the user's finger with pulsed or steady blue or green light. In some examples, the display of the electronic device 100 illuminates the user's finger with light emitted with a particular modulation pattern or frequency. In some examples, the display of the electronic device 100 illuminates the user's finger by alternating between blue and green light at a particular frequency, modulation, pulse pattern, waveform and so on; red light illumination may be due to undesirable subsurface scattering of red light in the user's finger. In still other examples, the display of the electronic device 100 illuminates the users finger with a portion of a contiguous image shown on the entire display. In other words, the portion(s) of the display below the user's fingerprint may not be specially or differently illuminated from other portions of the display; the display can continue to render whichever static or animated image or series of images appeared on the display prior to the user touching the display. In still further examples, the display of the electronic device can locally increase brightness below the user's finger, can locally increase contrast below the user's finger, can locally increase saturation below the user's finger, and so on.

In some embodiments, the user's finger can be illuminated during a fingerprint imaging operation in another manner. For example, in some cases, a side-firing illuminator can be integrated into the display stack. In a side-firing illumination operation, portions of the user's fingerprint in contact with the imaging surface (e.g., ridges of the fingerprint) can diffuse and/or reflect light emitted from the side-firing illuminator. Other light emitted from the illuminator is reflected away from the optical imaging array as a result of total internal reflection.

Figure 1B:
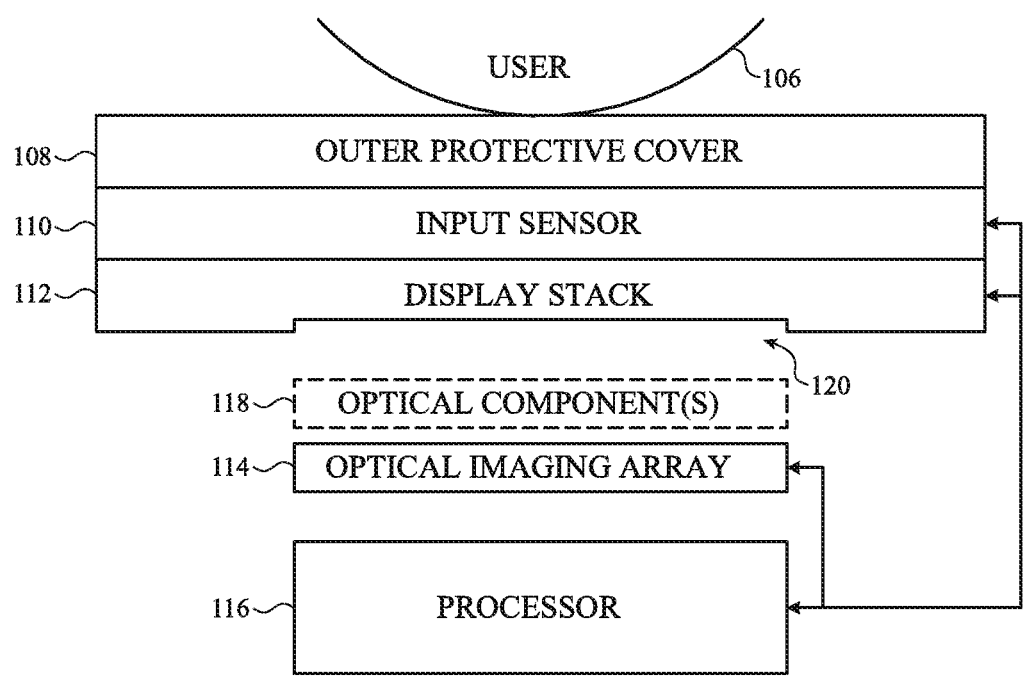
FIG. 1B depicts a simplified block diagram of the electronic device of FIG. 1A.

It may be appreciated that the foregoing description of FIG. 1A, and the various alternatives thereof and variations thereto are presented, generally, for purposes of explanation, and to facilitate a thorough understanding of various possible configurations of an electronic device incorporating a display stack suitable for through-display imaging, such as described herein. However, it will be apparent to one skilled in the art that some of the specific details presented herein may not be required in order to practice a particular described embodiment, or an equivalent thereof. For simplicity of description and illustration, FIG. 1B is provided. This figure depicts a simplified block diagram of the electronic device of FIG. 1A showing various operational and structural components that can be included in an electronic device configured to through-display imaging such as described herein.

In particular, the electronic device 100 includes an outer protective cover 108. The protective outer cover 108 defines an input surface for the user 106 and, additionally, protects and encloses various components of the electronic device 100. The protective outer cover 108 can be made from any number of suitable materials, whether transparent, translucent, or opaque, including, but not limited to, glass, plastic, acrylic, polymer materials, organic materials, and so on.

The electronic device 100 also includes an input sensor 110 disposed below the protective cover 108. The input sensor 110 can be any suitable input sensor including, but not limited to: a capacitive input sensor; a resistive input sensor; an inductive input sensor; an optical input sensor; and so on. The input sensor 110 can be configured to detect any suitable user input or combination of user inputs including, but not limited to: touch gestures; touch inputs; multi-touch inputs; force inputs; force gestures; multi-force inputs; pressure inputs; thermal inputs; acoustic inputs; and so on.

The electronic device 100 also includes a display stack 112 which can be disposed below the input sensor 110. The display stack 112 can be formed from a number of independent layers of material or materials that cooperate to define the active display area 104 (see, e.g., FIG. 1A). In many examples, the display stack 112 defines an organic light emitting diode display, but this may not be required. For example, in other cases, the display stack 112 can define, without limitation: a micro light emitting diode display; a liquid crystal display; an electronic ink display; a quantum dot display; and so on. As noted with respect to other embodiments described herein, the display stack 112 can define an array of discrete pixels that are independently addressable and controllable. The pixels of the display stack 112 can be disposed at a constant pitch or a variable pitch to define a single pixel density or one or more pixel densities.

As noted with respect to other embodiments described herein, a low pixel density region of the active display area 104 of the display stack 112 is positioned above an optical imaging array 114 such that the optical imaging array 114 can receive light transmitted through the inter-pixel regions of the low pixel density region of the active display area 104 of the display stack 112.

The optical imaging array 114 can be any suitable optical imaging array including one or more photosensitive elements arranged in any suitable pattern. In many examples, the optical imaging array 114 is a low fill-factor array of phototransistor or photodiode elements, but this may not be required of all embodiments.

The optical imaging array 114, the display stack 112, and the input sensor 110—among other elements, modules, or components of the electronic device 100—are communicably coupled to a processor 116. The processor 116 can be any suitable processor or circuitry capable of performing, monitoring, or coordinating one or more processes or operations of the electronic device 100. The processor 116 can be any suitable single-core or multi-core processor capable to execute instructions stored in a memory (not shown) to instantiate one or more classes or objects configured to interface with an input or output of one or more of the optical imaging array 114, the display stack 112, and/or the input sensor 110. In some examples, the processor 116 may be a dedicated processor associated with one or more of the optical imaging array 114, the display stack 112, and/or the input sensor 110. In other cases, the processor 116 may be a general purpose processor.

In still other embodiments, the electronic device 100 can include one or more optional optical components 118. The optional optical components 118 are typically positioned between the optical imaging array 114 and the display stack and can include, but may not be limited to: one or more lenses, filters, mirrors, actuators, apertures, irises, flash elements, flood illuminators, or other accessory optical elements, or combinations thereof.

In many examples, the electronic device 100 also includes an imaging aperture 120 defined into or through one or more layers of the display stack 112. The imaging aperture 120 is typically aligned with one or more low pixel density regions of the active display area 104 of the display stack 112 and, additionally aligned with the optical imaging array 114. As noted with respect to other embodiments described herein, the imaging aperture 120 can take any suitable size or shape.

Accordingly, generally and broadly in view of FIGS. 1A-1B, it is understood that an electronic device including a display suitable for through-display imaging can be configured in a number of ways. For example, although the electronic device 100 is depicted as a cellular phone, it may be appreciated that other electronic devices can incorporate a display stack such as described herein including, but not limited to: tablet devices; laptop devices; desktop computers; computing accessories; peripheral input devices; vehicle control devices; mobile entertainment devices; augmented reality devices; virtual reality devices; industrial control devices; digital wallet devices; home security devices; business security devices; wearable devices; health devices; implantable devices; clothing devices; fashion accessory devices; and so on.

Further it is appreciated that the electronic device can also include a processor, memory, power supply and/or battery, network connections, sensors, input/output ports, acoustic elements, haptic elements, digital and/or analog circuits for performing and/or coordinating tasks of the electronic device 100, and so on. For simplicity of illustration, the electronic device 100 is depicted in FIG. 1A without many of these elements, each of which may be included, partially and/or entirely, within the housing 102 and may be operationally or functionally associated with, or coupled to, the display of the electronic device 100.

Further, although the electronic device 100 includes only a single rectangular display, it may be appreciated that this example is not exhaustive. In other embodiments, an electronic device can include, or may be communicably coupled to, multiple displays, one or more of which may be suitable for through-display imaging. Such accessory/auxiliary displays can include, but may not be limited to: secondary monitors; function row or keyboard key displays; wearable electronic device displays; peripheral input devices (e.g., trackpads, mice, keyboards, and so on) incorporating displays; digital wallet screens; and so on. Similarly, a rectangular display may not be required; other embodiments are implemented with displays taking other shapes, including three-dimensional shapes (e.g., curved displays).

Similarly, although the display described in reference to the electronic device 100 is a primary display of an electronic device, it is appreciated that this example is not exhaustive. In some embodiments, a display stack can define a low-resolution auxiliary display, such as a monochromatic display or a greyscale display. In other cases, a display stack can define a single-image display, such as a glyph or icon. In one specific example, a power button for an electronic device can include a button cap incorporating a display such as described herein. The display can be configured to selectively display a power icon and/or a limited set of icons or glyphs associated with one or more functions the button may be configured to perform, or one or more configurable options the button is associated with (e.g., power options, standby options, volume options, authentication options, digital purchase options, user authentication options, and so on). In these examples, a limited-purpose, auxiliary, or secondary display can be configured to have partial transparency or translucency, such as described herein, to facilitate through-display imaging.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings. Particularly, it is understood that a display stack suitable for through-display imaging can be constructed and/or assembled in many suitable ways. For example, many embodiments described herein reference methods, constructions, and architectures that promote increased optical transmissivity through the display stack above an imaging aperture.

For example, a display stack such as described herein can include one or more regions having reduced pixel density relative to other regions. A reduced pixel density is typically associated with increased optical transmittance between pixels because the inter-pixel area through which light can traverse the display stack increases. In one implementation of this example, a circular region having a low pixel density (and therefore increased inter-pixel optical transmittance) can be inset within a rectangular region having a higher pixel density (and therefore lower inter-pixel optical transmittance). (see, e.g., FIG. 6A, discussed in greater detail below). In this example, the second region can be entirely inset within the first region, although this is not required. In a more specific example, a circular or oval region (in one example, generally the size and/or shape of a user's finger) can be inset within a rectangular region. In another example, a rectangular region can be inset within a larger rectangular region. (see, e.g., FIG. 6B, discussed in greater detail below). In another example, a square or rectangular region having a low pixel density can be positioned along one edge of another square or rectangular region having a higher pixel density. (see, e.g., FIGS. 6C-6D, discussed in greater detail below).

In yet another example, a rectangular region can surround two or more shaped regions taking any regular, repeating, symmetrical, asymmetrical, or arbitrary shape. In yet another example, a display stack can define a boundary region that has increased optical transmittance relative to a central region. The boundary can be continuous or discontinuous. In an alternate example, a display stack can define a central region that has increased optical transmittance relative to a boundary or perimeter region that is either continuous or discontinuous. In another example, a display stack can define a grid of regions in which alternating regions of the grid have differing optical transmittance. It may be appreciated that the examples above are not exhaustive; any suitable layout or distribution of regions of differing optical transmittance is possible.

Independent of a particular selected implementation, it is understood that reduced pixel density regions can be formed and/or defined in a number of suitable ways, some of which are described below in reference to FIG. 3. For example, in some cases, a display stack can be manufactured with a single pixel density, after which a subset of pixels in a selection region of the display stack can be removed (e.g., via etching, ablation, mechanical abrasion, and so on). In these embodiments, the reduced-density region can be formed, defined, or disposed in such a manner such that the lower pixel density is not readily apparent when viewed from a typical distance by an average user. For example, a reduced-density region may be formed from pixels of greater size and/or brightness, or in a different shape, such that the display stack appears to present a display of uniform resolution, brightness, contrast, and/or picture quality despite that pixel density varies across the area of the display stack. (see, e.g., FIG. 5C). In one specific example, a display stack can have a first region with a pixel density between 200-600 pixels per inch (e.g., 450 pixels per inch) and a second region between 100-300 pixels per inch (e.g., 225 pixels per inch). In these examples, an optical imaging array can be positioned below the display stack and aligned with the second region of pixels.

In some examples, pixel densities of certain regions can be substantially isotropic or substantially anisotropic. For example, in some embodiments, a first region can have an isotropic pixel density, whereas a second region can have the same pixel density as the first region along a first direction and a second pixel density along a second direction. In one specific example, a display stack defining a rectangular display can have a pixel density of approximately 450 pixels per inch along a length of the display and of approximately 225 pixels per inch along a width of the display. In some examples, adjacent anisotropic pixel density regions can be alternated (e.g., in a grid pattern, adjacent anisotropic pixel density regions are angularly offset from one another) so as to obscure the presence or appearance of lower pixel density.

In some examples, a display stack can define various regions having different electronic trace layouts than other regions. (see, e.g., FIG. 5D). As noted with respect to other embodiments described herein, a low trace density results in increased optical transmittance through the display stack in that region. For example, a first region can include traces disposed and/or defined with a first density whereas a second region can define traces disposed and/or defined with a second density.

In some examples, a display stack can define regions having different patterns of subpixels and/or different subpixel triad layouts relative to other adjacent regions. (see, e.g., FIGS. 5A-5C). As noted with respect to other embodiments described herein, expanded subpixel triads can be associated with increased optical transmittance. (see, e.g., FIGS. 5B-5C). For example, in one embodiment, a first region can be defined by a diamond-pattern pixel layout whereas a second region can be defined by columnar subpixel triads. In another example, a first region is defined by a first dot pitch whereas a second region is defined by a second dot pitch. Other pixel layouts and/or subpixel triad layouts are possible.

In some examples, a display stack can define regions having different subpixel colors or arrangements than other regions. More specifically, a display stack can define regions in which one or more subpixel colors are omitted or shared between multiple subpixels. (see, e.g., FIG. 5A). As noted with respect to other embodiments described herein, partial or incomplete subpixel triads are typically associated with increased optical transmittance due to the increased interpixel area through which light can traverse the display stack. In one example, a first region can be defined by a regular distribution of subpixels into triads of red, green, and blue whereas a second region can be defined by a distribution of subpixels of only green and blue. In other cases, adjacent subpixel pairs (e.g., green and blue) can share a single red subpixel which may be larger than either subpixels of the green/blue subpixel pair.

In some examples, a display stack can include regions implemented with different display technology than other regions of the same display stack. For example, a first region can defined by liquid-crystal technology (generally low transmittance) whereas another region can be defined by organic light-emitting diode technology (higher transmittance). Differing display technologies that can be used together in a single display stack can define, but may not be limited to: liquid crystal technology; organic light-emitting diode technology; quantum dot technology; plasma backlit technology; vertical-cavity surface-emitting laser technology; projection technology; electronic ink technology; and so on.

Figure 2A:
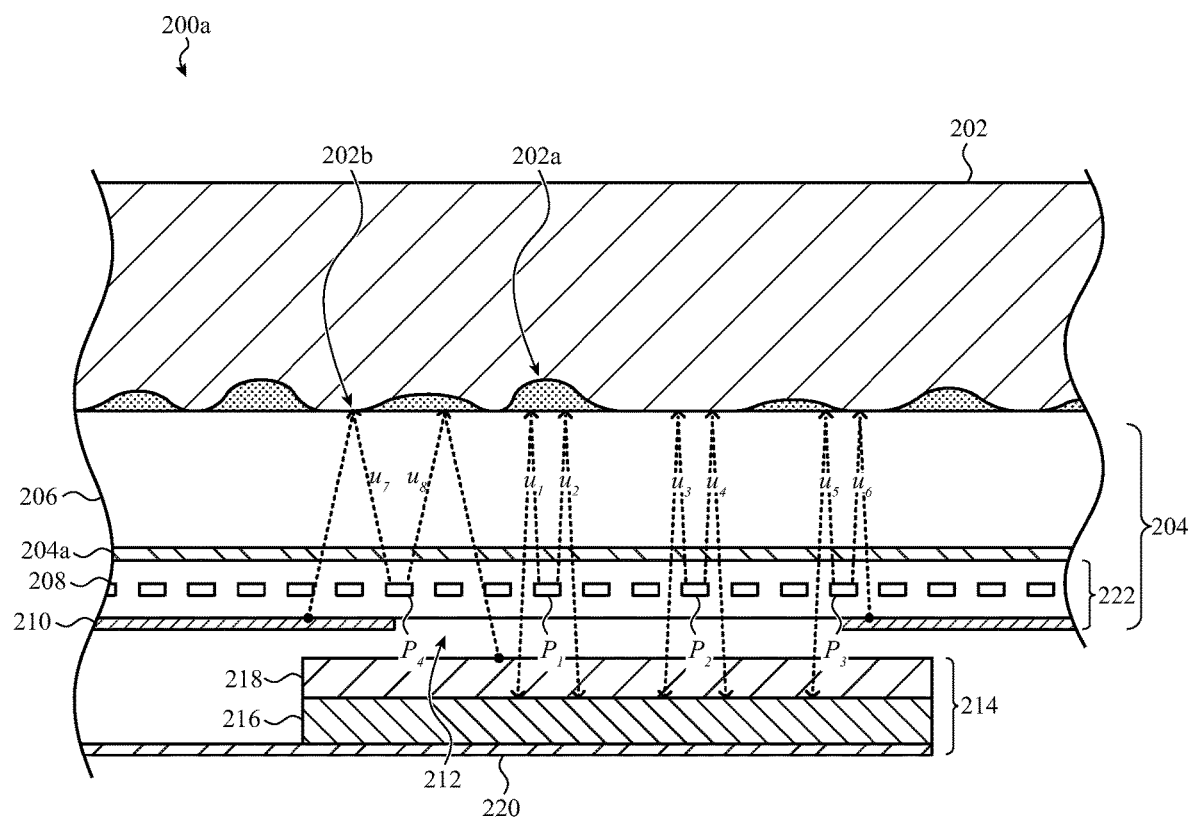
FIG. 2A depicts an example cross-section of the display stack of FIG. 1A, taken through line A-A, depicting an optical imaging array positioned below, and aligned with, an imaging aperture defined through an opaque backing of the display stack.

Certain example implementations of an optical imaging array positioned behind an imaging aperture defined by a display stack are depicted in FIGS. 2A-2D. In particular, FIG. 2A depicts an example cross-section of the display stack of FIG. 1A, touched by a user, taken through line A-A, depicting an optical imaging array positioned below an imaging aperture defined through an opaque backing of the illustrated display stack.

More specifically, FIG. 2A depicts a through-display imaging architecture 200a for an organic light-emitting diode display that facilitates imaging of a fingerprint of a user 202 through a display stack 204. The display stack 204 in this example includes a protective outer cover 206, an emitting layer 208 and an opaque backing layer 210. In other cases, the display stack 204 includes other layers such as, but not limited to: thin-film transistor layers; capacitive touch sensing layers; force sensing layers; backlight layers; polarizer layers; and so on.

The protective outer cover 206 of the display stack 204 is typically formed from an optically transparent substrate material such as glass, acrylic, plastic, or the like. The protective outer cover 206 defines an input surface that can be touched by the user 202. In many examples, the protective outer cover 206 defines at least a portion of an exterior surface of a housing of an electronic device. In other words, the protective outer cover 206 may at least partially enclose and/or seal one or more layers of the display stack 204, such as the emitting layer 208 or the opaque backing layer 210.

The emitting layer 208 of the display stack 204 includes a number of individual pixels or subpixels, some of which are identified as pixels $P_1$-$P_4$. The pixels of the emitting layer 208 can be arranged in any suitable pattern. As illustrated, the pixels of the emitting layer 208 are arranged in a regular linear pattern, but this may not be required and some pixels may be arranged closer together or farther apart.

The opaque backing layer 210 of the display stack 204 can provide structural support for one or more layers of the display stack 204, although this is not required. In some cases, the opaque backing layer 210 is formed from an optically reflective material whereas in others, the opaque backing layer 210 is formed from an ink or light-absorbing material.

The opaque backing layer 210 defines an imaging aperture 212. As noted with respect to other embodiments described herein, the imaging aperture 212 can be defined to take any suitable size or shape. In some cases, the imaging aperture 212 is filled with an optically clear material, such as an optically-clear adhesive. In further cases, the imaging aperture 212 can extend through additional opaque, transparent, or translucent layers of a display stack.

The through-display imaging architecture 200a also includes an optical imaging array 214. The optical imaging array 214 includes an array of photosensitive elements 216 positioned below a narrow field-of-view filter 218. The narrow field-of-view filter 218 filters light received by the array of photosensitive elements 216 such that only light that is substantially normal to the array of photosensitive elements 216 is received (e.g., as one example, ±10% of ninety degrees measured from a planar surface of the array of photosensitive elements 216). In other examples, the narrow field-of-view filter 218 may not be required or included.

The array of photosensitive elements 216 of the through-display imaging architecture 200a can be communicably coupled to a processor or a processing circuitry (not shown) via a circuit board 220. The circuit board 220 can be formed from a rigid or flexible substrate. The processor or processing circuitry can be a general purpose processor or circuitry or an application-specific processor or circuitry configured for, in many examples, encrypted or otherwise secure data processing and/or storage.

As a result of the depicted construction, an image of the fingerprint of the user 202 can be obtained by the optical imaging array 214 through the display stack 204. More specifically, during a fingerprint imaging operation, one or more pixels of the emitting layer 208 below or adjacent to the user's fingerprint can be illuminated (with any suitable modulation, brightness, color or spectrum, and so on) when the user 202 touches the protective outer cover 206. Light emitted from the illuminated pixels or subpixels is directed toward the user's fingerprint and, in turn, is reflected toward the optical imaging array 214 by the various features of the user's fingerprint in contact with the protective outer cover 206 (e.g., the valleys of the user's fingerprint, such as the valley 202a, reflect a different quantity of light than the ridges of the user's fingerprint, such as the ridge 202b). A portion of the reflected light passes through inter-pixel regions of the emitting layer 208 and through the imaging aperture 212 and continues toward the optical imaging array 214. In this manner, the optical imaging array 214 receives reflected light originally emitted by at least one pixel of the display stack 204.

As noted above, the narrow field-of-view filter 218 rejects/blocks light that is not substantially normal to the array of photosensitive elements 216. For example, the rays $u_1$-$u_5$, emitted from the pixels $P_1$-$P_3$, can be captured by the array of photosensitive elements 216 whereas the rays $u_6$-$u_8$, emitted from the pixels $P_3$-$P_4$, are rejected/blocked by the narrow field-of-view filter 218. As a result of this construction, the array of photosensitive elements 216 can capture an image of the portion of the fingerprint that is positioned above the imaging aperture 212.

In many cases, the image of the fingerprint (or the portion of the fingerprint) can be filtered by a processor or processing system (not shown) after the image is captured by the array of photosensitive elements 216. In many embodiments, spatial filtering can remove aberrations in the image resulting from the physical structure of the emitting layer 208 and/or other layers of the display stack 204 (in one non-limiting example, the arrangement of opaque pixels of the emitting layer 208 may cause an array of dark spots in the image). An example spatial filtering technique that may be applied is point-source filtering.

In this manner, the combination of the opaque backing layer 210, the imaging aperture 212, and the emitting layer 208 cooperate to define a display suitable for through-display imaging, identified in the figure as the display 222.

In some embodiments, an optical imaging sensor can also be associated with, or positioned relative to, one or more lenses, filters, mirrors, actuators, apertures, irises, flash elements, flood illuminators, or other accessory optical elements, or combinations thereof. Example accessory optical elements that can be optically coupled and/or associated with one or more optical imaging sensors—such as the optical imaging array 214 of FIG. 2A—include but are not limited to: micro lenses; macro lenses; light guides; total-internal reflection interfaces; mirrored interfaces; digitally-variable mirrors; collimating filters; polarizing filters; color filters; infrared cut filters; ultraviolet cut filters; beam-directing lenses; beam-directing mirror arrays; and so on.

Figure 2B:
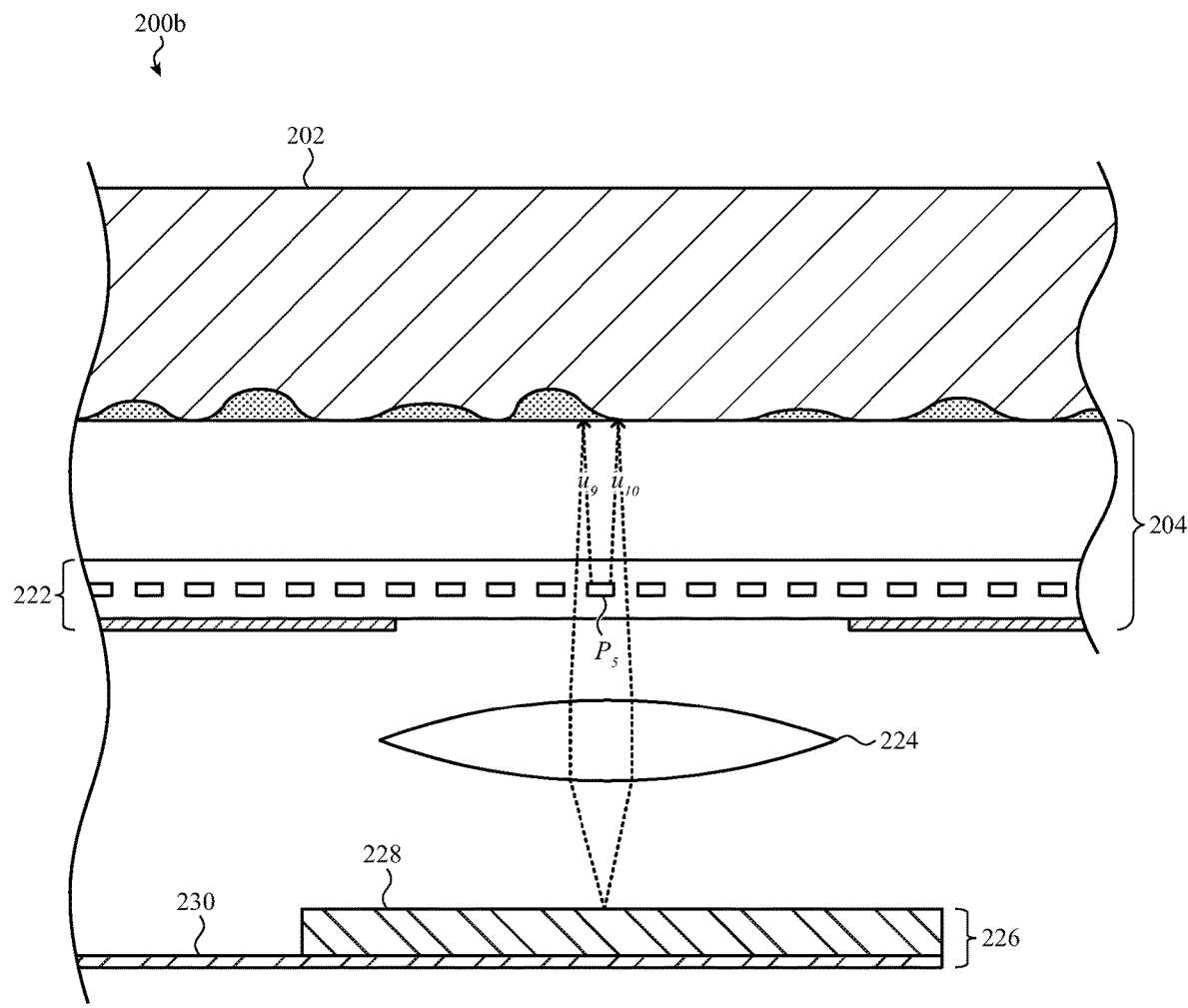
FIG. 2B depicts another example cross-section of the display stack of FIG. 1A, depicting an optical imaging array and lens structure positioned below, and aligned with, an imaging aperture defined through an opaque backing of the display stack.

For example, FIG. 2B depicts another through-display imaging architecture, identified as the through-display imaging architecture 200b, for an organic light-emitting diode display that facilitates imaging of a fingerprint of a user 202 through a display stack 204. The display stack 204 in this example can be configured in the same manner as the display stack 204 described in reference to FIG. 2A; accordingly this description is not repeated.

In this embodiment, a lens 224 can be positioned below the imaging aperture of the display 222 and an image sensor 226. The image sensor 226 includes an array of photosensitive elements 228 (e.g., complementary metal oxide semiconductors) coupled to a substrate or circuitry board 230. In this embodiment, light emitted from the display 222 that reflects from the fingerprint of the user 202 is focused by the lens 224 onto the array of photosensitive elements 228 of the image sensor 226. Example rays $u_9$-$u_{10}$ are provided corresponding to light emitted from the pixel $P_5$, reflected from the user 202, and received at the image sensor 226.

Figure 2C:
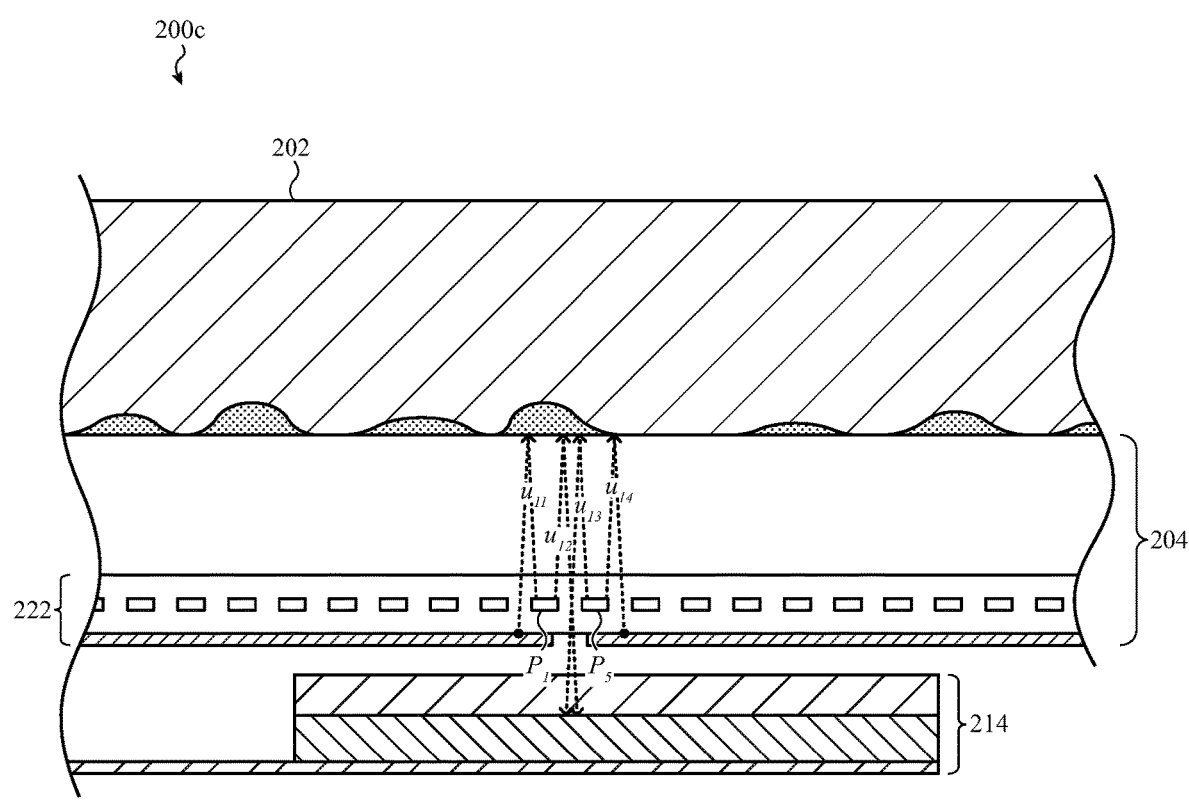
FIG. 2C depicts another example cross-section of the display stack of FIG. 1A, depicting an optical imaging array positioned below a pinhole aperture defined through an opaque backing of the display stack.

In some embodiments, a through-display imaging architecture can include a number of pinhole apertures in place of a single image aperture. For example, FIG. 2C depicts a through—display imaging architecture 200c for imaging a fingerprint of a user 202 through a display stack 204. In this example, the display 222 includes a number of pinhole-size imaging apertures, one of which is shown as formed between the pixels $P_1$ and $P_5$. The various pinhole apertures can each, independently, function as a pinhole camera (e.g., a camera obscura) positioned to image a portion of the fingerprint of the user 202.

Any number or distribution of pinhole imaging apertures can be used in different embodiments. In one example, an array of pinhole images apertures is offset from pixels of the display 222 such that each pinhole imaging aperture is positioned below an inter-pixel region of the display 222. It may be appreciated that any suitable number of pinhole imaging apertures can be defined in a number of suitable patterns above an optical imaging array 214.

As noted above, the embodiments described in reference to FIGS. 2A-2C typically illuminate the finger of the user 202 by activating pixels below the user's finger. However, this may not be required of all embodiments.

Figure 2D:
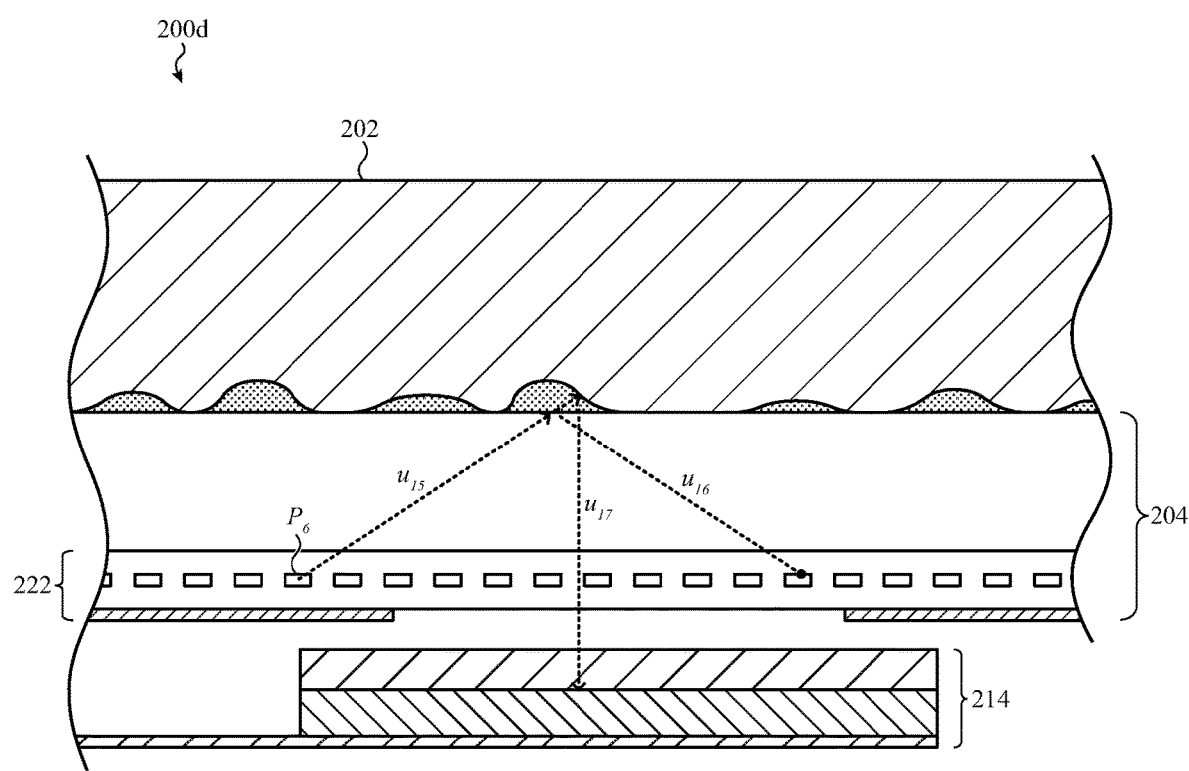
FIG. 2D depicts another example cross-section of the display stack of FIG. 1A, depicting angled illumination of an optical imaging array positioned below an imaging aperture defined through an opaque backing of the display stack.

For example, FIG. 2D depicts a through-display imaging architecture 200d that illuminates the user's fingerprint from a pixel offset from the imaging aperture. The ray $u_{15}$ is shown originating at pixel $P_6$, offset from the imaging aperture of the display 222. As a result of the offset, the fingerprint of the user 202 is illuminated at an angle. As a result of the angle, portions of one or more valleys of the user's fingerprint can be illuminated to a different extent than if the same valley were illuminated from below. As such, by sequentially changing the pixel or pixels used to illuminate the fingerprint of the user—and thus the angle of illumination—the optical imaging array 214 can capture a series of images of the fingerprint of the user 202. Variations between different images can be analyzed to determine three-dimensional characteristics (e.g., depth information) of one or more valleys of the fingerprint of the user 202.

It may be appreciated that the foregoing description of FIGS. 2A-2D, and various alternatives thereof and variations thereto are presented, generally, for purposes of explanation, and to facilitate a thorough understanding of various possible configurations of an optical imaging array positioned behind a display stack with locally-increased optical transmittance, such as described herein. However, it will be apparent to one skilled in the art that some of the specific details presented herein may not be required in order to practice a particular described embodiment, or an equivalent thereof.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings. Particularly, it is understood that large-scale imaging apertures and/or pinhole apertures (herein, collectively, "imaging apertures") can be formed in a number of ways through one or more layers of a display stack.

For example, in the illustrated embodiments, imaging apertures are defined through an opaque backing layer of the display stack. In other embodiments, a pinhole and/or imaging aperture can be defined through multiple layers of the display stack, such as, but not limited to: structural layers; polarizer layers; backlight layers; metal frames; reflector layers; liquid crystal layers; thin-film transistor layers; organic light-emitting diode anode or cathode layers; encapsulation layers; ink layers; and so on.

Some embodiments include a single imaging aperture, whereas others include multiple discrete, grouped or patterned imaging apertures. For example, in one embodiment, an array of pinhole apertures can be defined through a backing of a display stack. The array of pinhole apertures can be formed in a regular, tessellated, symmetric, asymmetric, or irregular pattern and may take any suitable shape.

In still other examples, an imaging aperture may not be required. In these embodiments, an optical imaging array can be positioned within a display stack. Example implementations of an optical imaging array positioned within a display stack are depicted in FIGS. 2E-2G.

Figure 2E:
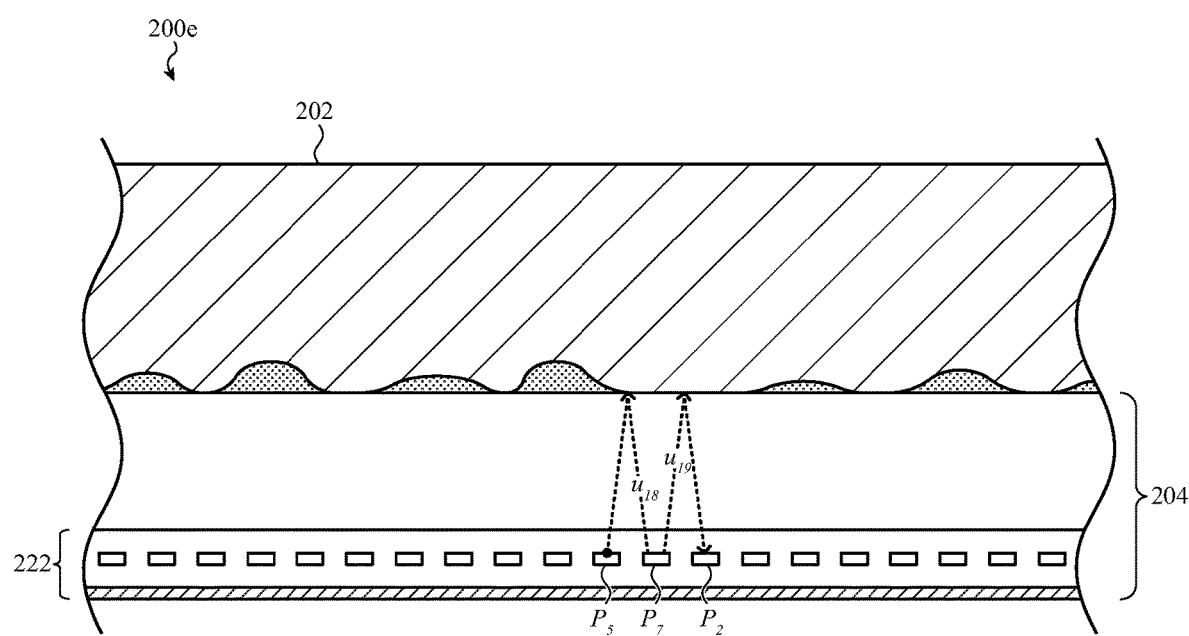
FIG. 2E depicts another example cross-section of the display stack of FIG. 1A, depicting an organic light-emitting diode array that may be operated as a self-illuminating optical imaging array.

FIG. 2E depicts another example cross-section of the display stack of FIG. 1A, depicting an organic light-emitting diode array that may be operated as a self-illuminating optical imaging array. More specifically, in this embodiment, an organic light-emitting diode pixel can be used as an optical sensing element. In the illustrated embodiment, a through-display imaging architecture 200e can image a fingerprint of a user 202 when the user 202 touches a protective outer cover of a display stack 204. In this example, pixel $P_7$ can be used to illuminate the fingerprint of the user 202. During a fingerprint imaging operation, pixels adjacent to the pixel $P_7$ (e.g., pixels $P_5$ and $P_2$) are not illuminated, but instead can be used to receive light reflected (e.g., $u_{18}$-$u_{19}$) from the user's finger. It may be appreciated that any suitable number, pattern, or arrangement of pixels can be used to illuminate or image the user's finger.

In yet other embodiments, an optical imaging array can be integrated into a display stack. FIGS. 2F-2G depict another example through-display imaging architecture 200f that includes an array of optical sensing elements disposed between and/or below pixels of an organic light-emitting diode display. In particular, the through-display imaging architecture 200f includes an array of optical sensing elements disposed in inter-pixel regions of the display 222. Each optical sensing element includes a collimating filter 232 positioned above a photosensitive element 234. As a result of this construction, when a pixel of the display emits light that is reflected by a user's fingerprint, the reflected light (e.g., $u_{20}$-$u_{21}$) can be received by the photosensitive elements and an image of the fingerprint can be obtained.

Figure 2F:
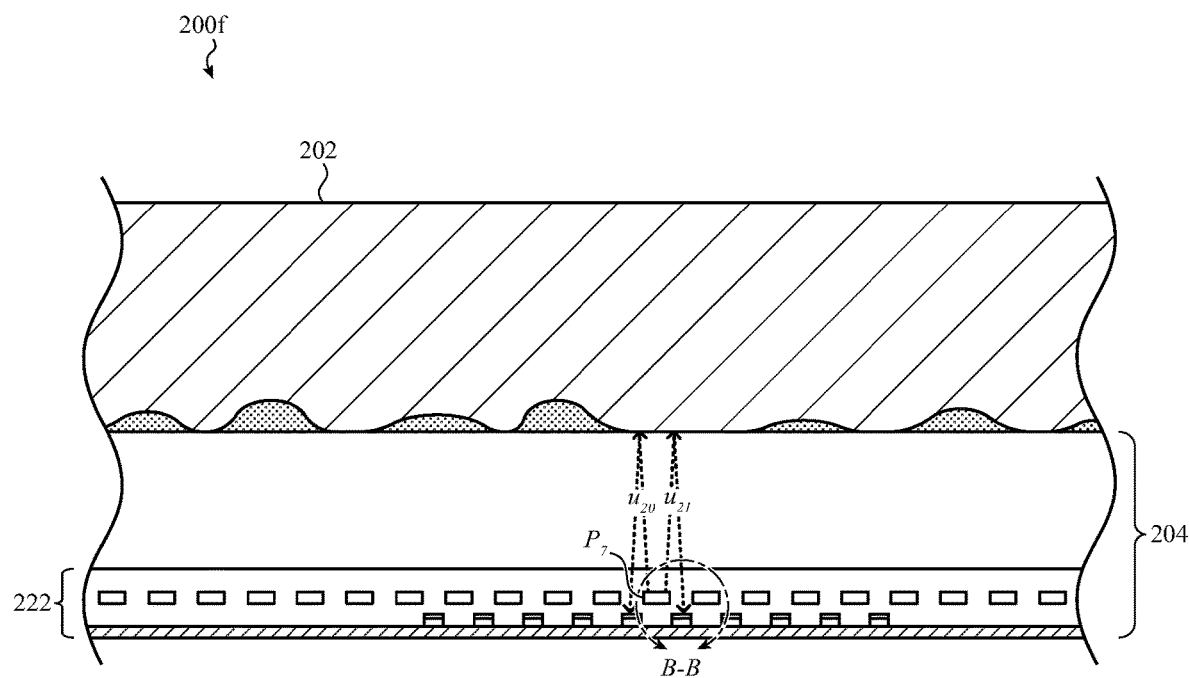
FIG. 2F depicts another example cross-section of the display stack of FIG. 1A, depicting an optical imaging array encapsulated within a light-emitting layer of the display stack.
Figure 2G:
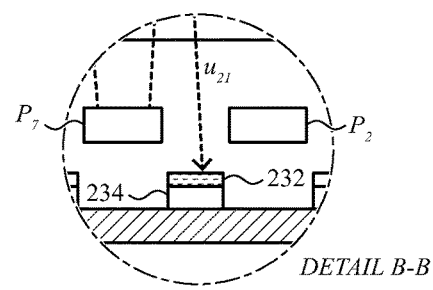
FIG. 2G depicts an enlarged detail view of the example cross-section of the display stack of FIG. 2F, enclosed within the circle B-B.

It may be appreciated that the foregoing description of FIGS. 2E-2G, and various alternatives thereof and variations thereto are presented, generally, for purposes of explanation, and to facilitate a thorough understanding of various possible configurations of an optical imaging array positioned within a display stack, such as described herein. However, it will be apparent to one skilled in the art that some of the specific details presented herein may not be required in order to practice a particular described embodiment, or an equivalent thereof.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings. Particularly, it is understood that an optical imaging array can be formed in a display stack in a number of suitable ways.

Further, in certain examples, an optical imaging array can be partially integrated into a display stack layer and, additionally, partially disposed below a display stack. For example, in one embodiment, an organic light-emitting diode can be used for both emitting and capturing light (see, e.g., FIG. 2E). In this embodiment, an optical imaging array can also be positioned below the display stack (see, e.g., FIGS. 2A-2D) in order to capture light traversing inter-pixel regions of the display stack.

More generally, it is understood in view of FIGS. 2A-2G that various features of each described embodiment can be combined in arrangements not shown or described above. For example, in one embodiment, multiple optical imaging arrays or optical imaging sensors can be operated together to capture additional information.

In other examples, an optical imaging array can be used by an electronic device (see, e.g., FIG. 1A) for different purposes at different times or in different modes. For example, in one mode an optical imaging array can be operated to obtain an image, or a series of images, corresponding to a fingerprint of a user touching a specific portion of an electronic device display (see, e.g., FIGS. 1A-2A). In another mode, the same optical imaging array can be operated to obtain ambient color temperature information used to adjust one or more characteristics of the display. In yet another mode, the same optical imaging array can be operated as a proximity sensor (e.g., can be used to detect a user's finger as it approaches the display to, as one example, increase a duty cycle of an input sensor in anticipation of a touch or force input).

Generally and broadly, FIGS. 3-5D depict various arrangements of pixels, subpixel groups, and trace layouts that can promote increased optical transmittance through a display such as described herein. The various techniques and constructions described below can be combined with any of the embodiments depicted and described in reference to FIGS. 2A-2G.

Figure 3:
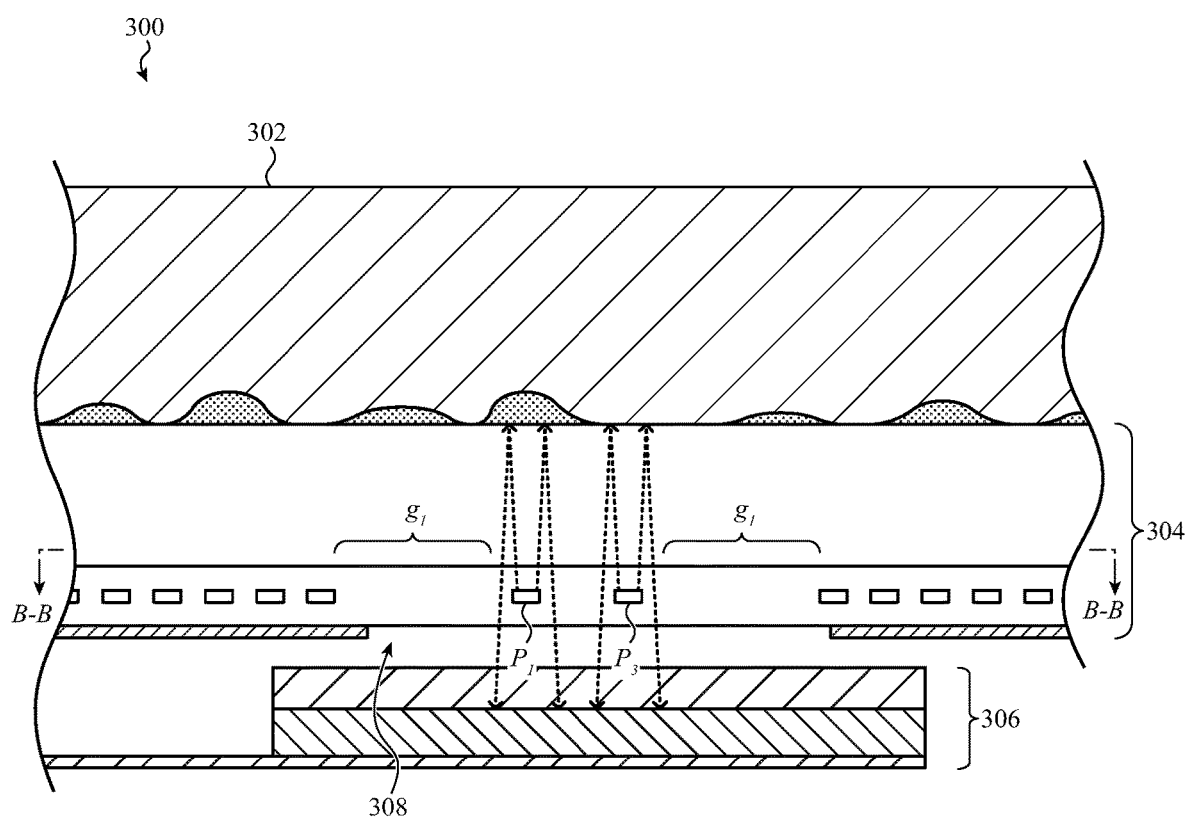
FIG. 3 depicts an example cross-section of a display stack, such as described herein, depicting an optical imaging array positioned below a region of reduced pixel density.

For example, FIG. 3 depicts a through-display imaging architecture 300 for an organic light-emitting diode display that facilitates imaging of a fingerprint of a user 302 through a display stack 304. The display stack 304 can be configured in any suitable manner, such as described above in reference to FIGS. 2A-2G; this description is not repeated.

As with other embodiments described herein, the through-display imaging architecture 300 also includes an optical imaging array 306 positioned below, and at least partially aligned with, an imaging aperture 308. In some cases, the optical imaging array 306 may have a larger area than the imaging aperture 308 (such as shown), but this may not be required.

In this embodiment, the display stack 304 defines multiple regions having different pixel densities, defined by different pixel/subpixel pitch. More specifically, as shown, a first pixel density above the imaging aperture 308—identified as the pitch $g_1$—is lower than a second pixel density in other regions of the display having a smaller pixel pitch. In other words, pixels of the display stack 304 can be more sparsely distributed above the imaging aperture 308. As noted with respect to other embodiments described herein, sparsely distributed pixels (e.g., lower pixel or subpixel density) are associated with a larger inter-pixel area which, in turn, locally increases the optical transmittance of the display stack 304 above the imaging aperture 308.

Pixels of the display stack 304—or other display stacks having reduced pixel density and, additionally, increased optical transmittance—can be distributed in any suitable manner or pattern. Example configurations are depicted in FIGS. 4A-5C. However, it may be appreciated that these embodiments are not exhaustive and other configurations and constructions are possible.

Figure 4A:
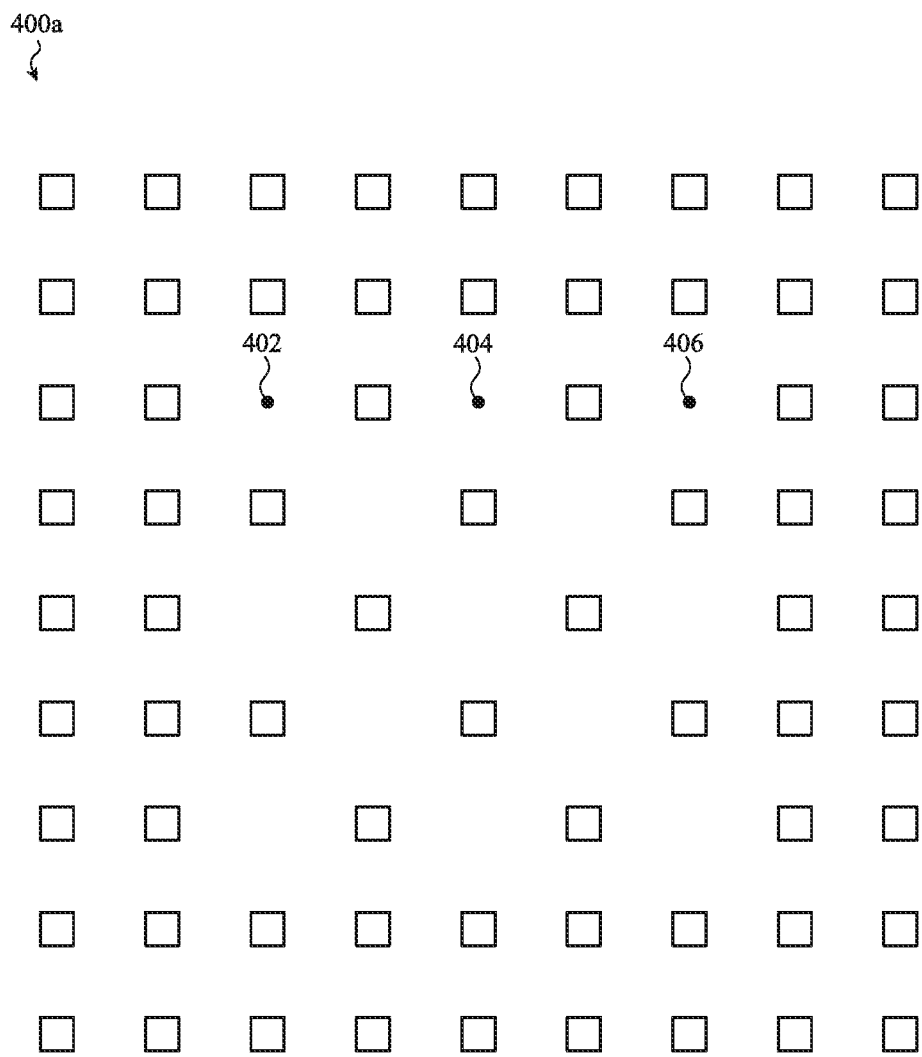
FIG. 4A depicts an example arrangement of pixels of a display stack defining a region of reduced pixel density resulting in locally-increased inter-pixel transmittance.

FIG. 4A depicts an example arrangement of pixels 400a (also referred to as a pixel or subpixel distribution pattern)

of a display stack defining a region of reduced pixel density resulting in locally-increased optical transmittance. In this embodiment, generally square-shaped elements are distributed in a regular grid pattern, each of which is understood to be a pixel or subpixel of a display such as described herein; these elements are not individually labeled for simplicity of illustration. In a central region of the example arrangement of pixels 400a, a set of pixels in the grid are skipped or otherwise removed, defining holes in the grid pattern of pixels. These omitted pixels (e.g., omitted pixel regions 402, 404, 406) locally increase the optical transmittance of the display stack.

Figure 4B:
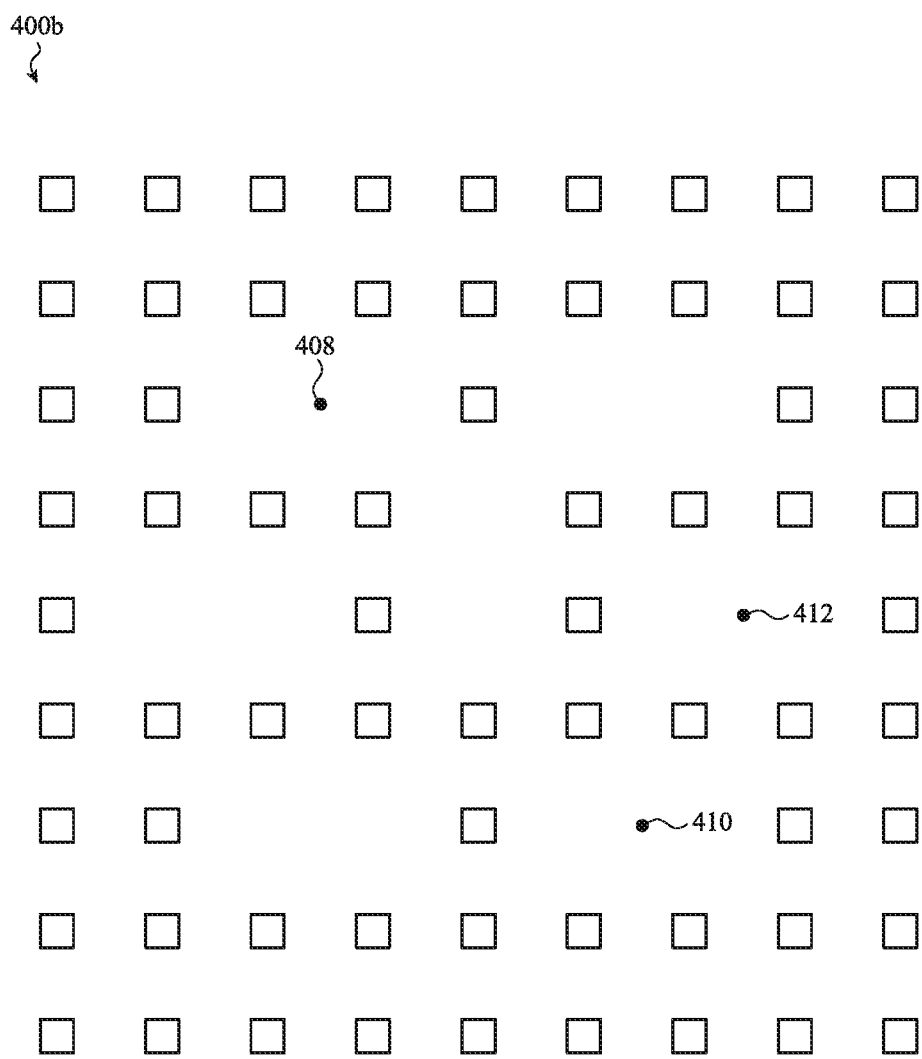
FIG. 4B depicts another example arrangement of pixels of a display stack resulting in locally-increased inter-pixel transmittance.

The pattern shown in FIG. 4A is merely one example. FIG. 4B depicts another example arrangement of pixels 400b of a display stack resulting in locally-increased optical transmittance showing an array of square elements, each of which is understood to be a pixel or subpixel of a display such as described herein. In this example, sections of rows and/or columns can be omitted to define omitted pixel regions 408, 410, 412. By omitting sections of rows and/or columns, anisotropic pixel density can be achieved; an average horizontal pixel density of the example arrangement of pixels 400b may be greater than an average vertical pixel density of the example arrangement of pixels 400b.

Figure 4C:
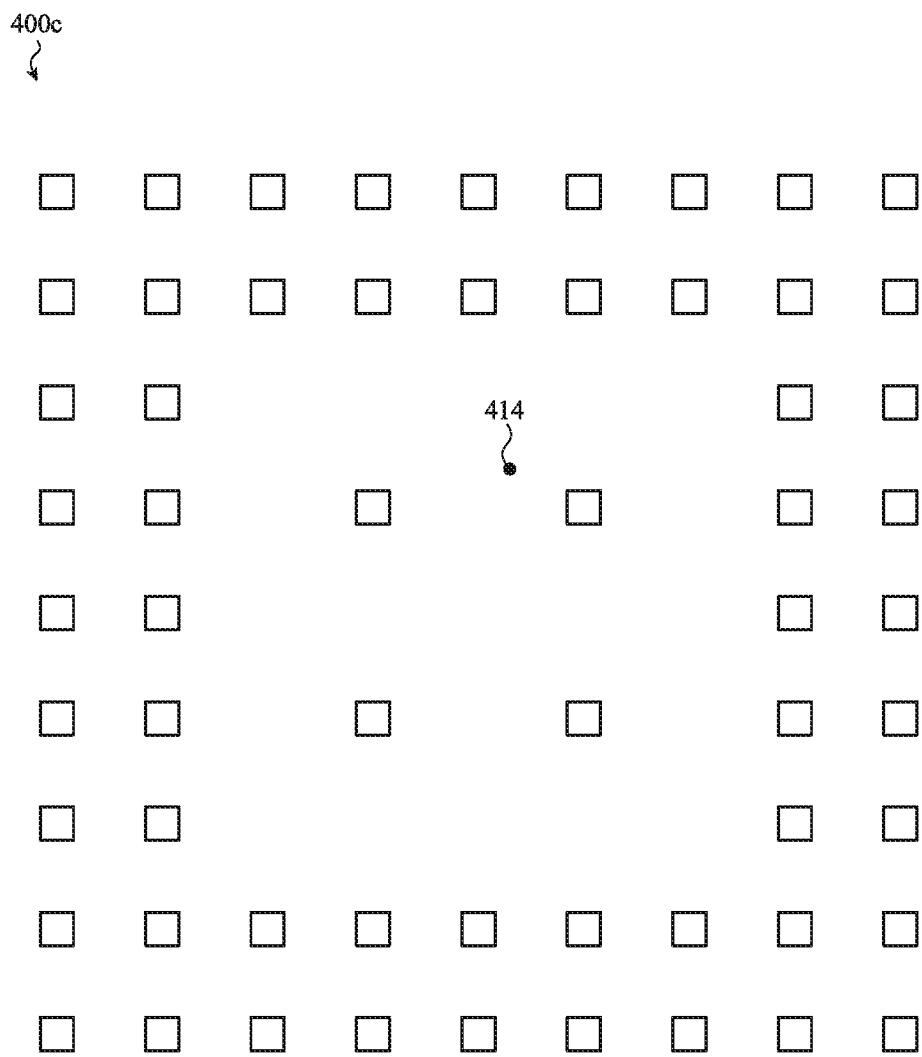
FIG. 4C depicts another example arrangement of pixels of a display stack resulting in locally-increased inter-pixel transmittance.

In yet another example, a two-dimensional area of omitted pixels is possible. For example, FIG. 4C depicts another example arrangement of pixels 400c of a display stack resulting in locally-increased optical transmittance. In this example, an interior region of pixels 414 defines a two-dimensional pattern of omitted pixels.

The example embodiments described above in reference to FIGS. 3-4C are provided, generally, for purposes of explanation and should not be construed as limiting. To the contrary, one of skill in the art will appreciate that many different means of defining different pixel densities into a single display are possible in view of the various embodiments described herein.

For example, in some embodiments, a low pixel density region can be characterized by omitting every other pixel. In another example, a low pixel density region can be characterized by omitting pixels in a geometric pattern such as, but not limited to: concentric shapes; serpentine patterns; spiral patterns; arbitrary patterns; and so on. In some cases, a display stack can define a pixel density transition region between a high pixel density region and a low pixel density region. In other cases, a transition region may not be required.

Figure 5A:
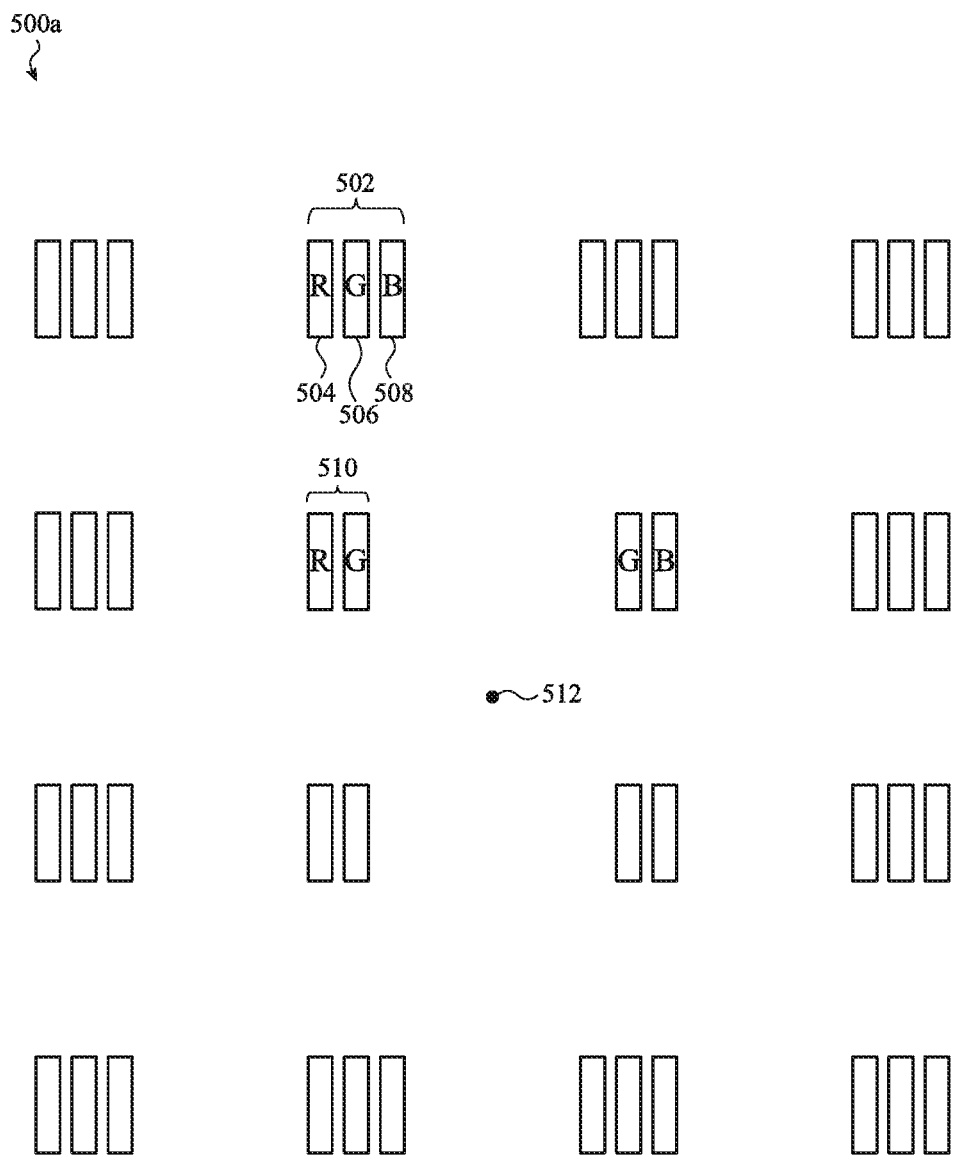
FIG. 5A depicts an example arrangement of subpixels of a display stack defining a region of reduced pixel density resulting in locally-increased inter-pixel transmittance.
Figure 5B:
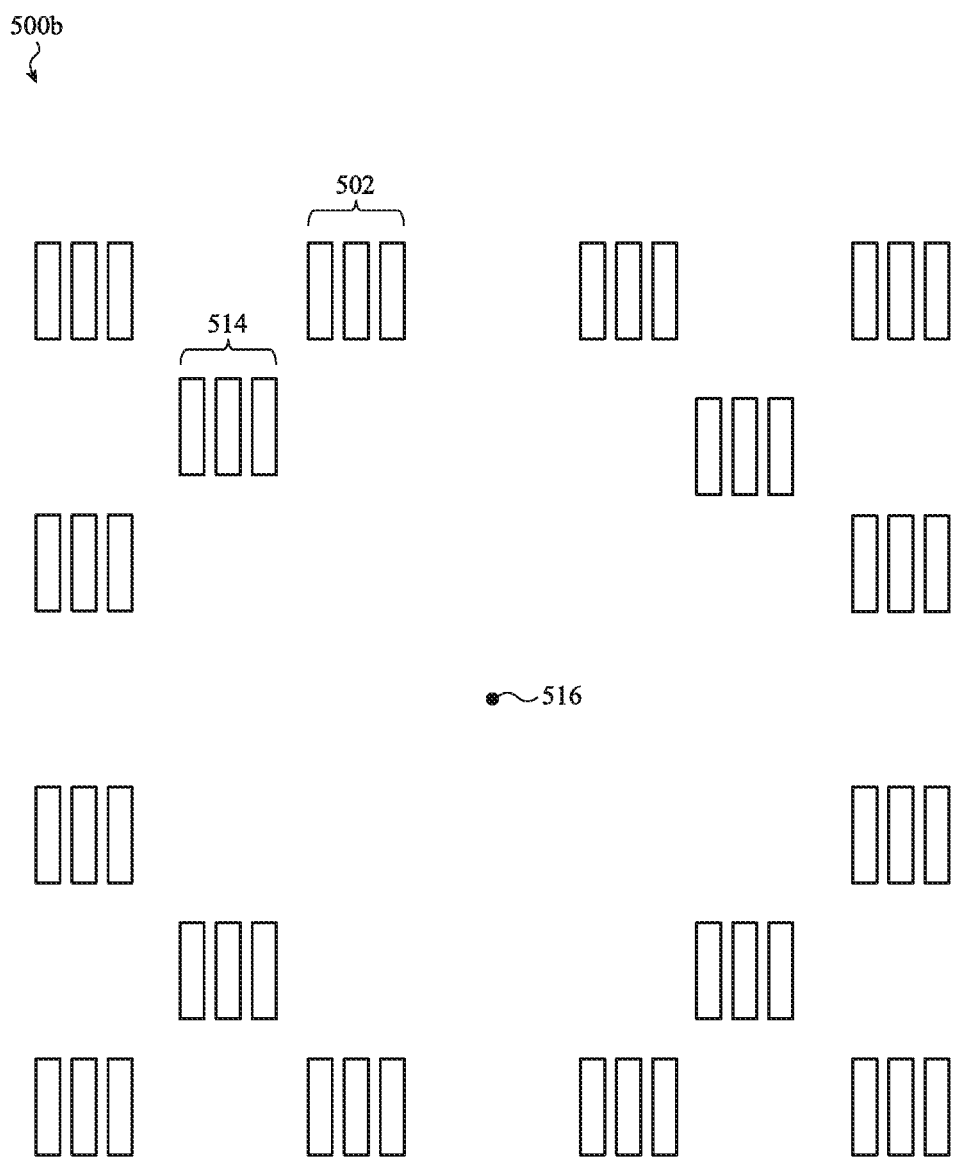
FIG. 5B depicts another example arrangement of subpixels of a display stack defining a region of reduced pixel density resulting in locally-increased inter-pixel transmittance.
Figure 5C:
FIG. 5C depicts another example arrangement of subpixels of a display stack defining a region of reduced pixel density resulting in locally-increased inter-pixel transmittance.
Figure 5C:
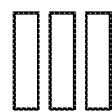
Figure 5C:
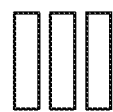
Figure 5C:
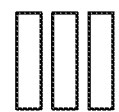
Figure 5C:
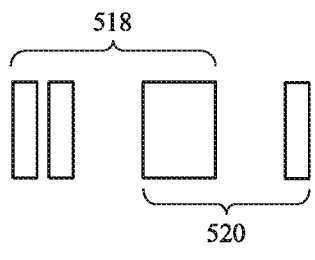
Figure 5C:
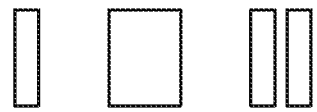
Figure 5C:
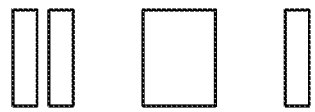
Figure 5C:
Figure 5C:
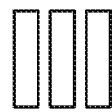
Figure 5C:
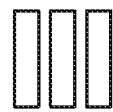
Figure 5C:
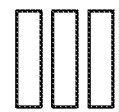

In still other embodiments subpixel groups in a region of a display stack can be modified to provide locally-increased optical transmittance. FIGS. 5A-5C depict various examples.

FIG. 5A depicts an example arrangement of subpixels 500a of a display stack defining a region of reduced pixel density resulting in locally-increased optical transmittance. In particular, the example arrangement of subpixels 500a as depicted includes sixteen groups of subpixels, one of which is identified as the subpixel group 502. The subpixel group 502 includes three subpixels, namely a red subpixel 504, a green subpixel 506, and a blue subpixel 508. In this embodiment, one or more subpixel groups can omit one or more colors from the group, resulting in incomplete subpixel groups, one of which is identified as the incomplete subpixel group 510. In this embodiment, the omitted subpixels increase an inter-pixel area 512 that, in turn, locally increase optical transmittance of the display stack. In this example a blue pixel is omitted from the incomplete subpixel group 510 whereas a horizontally-adjacent incomplete subpixel group may omit a red pixel. In this manner, adjacent incomplete subpixel groups omitting different subpixel colors can be operated together to produce a wide range of colors.

In other cases, subpixel groups can be shifted to define an area of decreased pixel density. FIG. 5B depicts an example arrangement of subpixels 500b of a display stack defining a region of reduced pixel density resulting in locally-increased optical transmittance. In this example, a set of subpixel groups—including the subpixel group 514—are moved away from a central region of an inter-pixel area 516, thereby increasing optical transmittance within the inter-pixel area 516.

In yet another embodiment, subpixel groups can share one or more large-size subpixels. In particular, FIG. 5C depicts an example arrangement of subpixels 500c of a display stack defining a region of reduced pixel density resulting in locally-increased optical transmittance. In the illustrated embodiment, subpixel groups 518 and 520 share a large-size common pixel. As a result of this construction, each subpixel group 518 and 520 independently occupy a smaller area which, in turn, increases an area of an inter-pixel region 522, thereby increasing optical transmittance within the inter-pixel area 522.

Figure 5D:
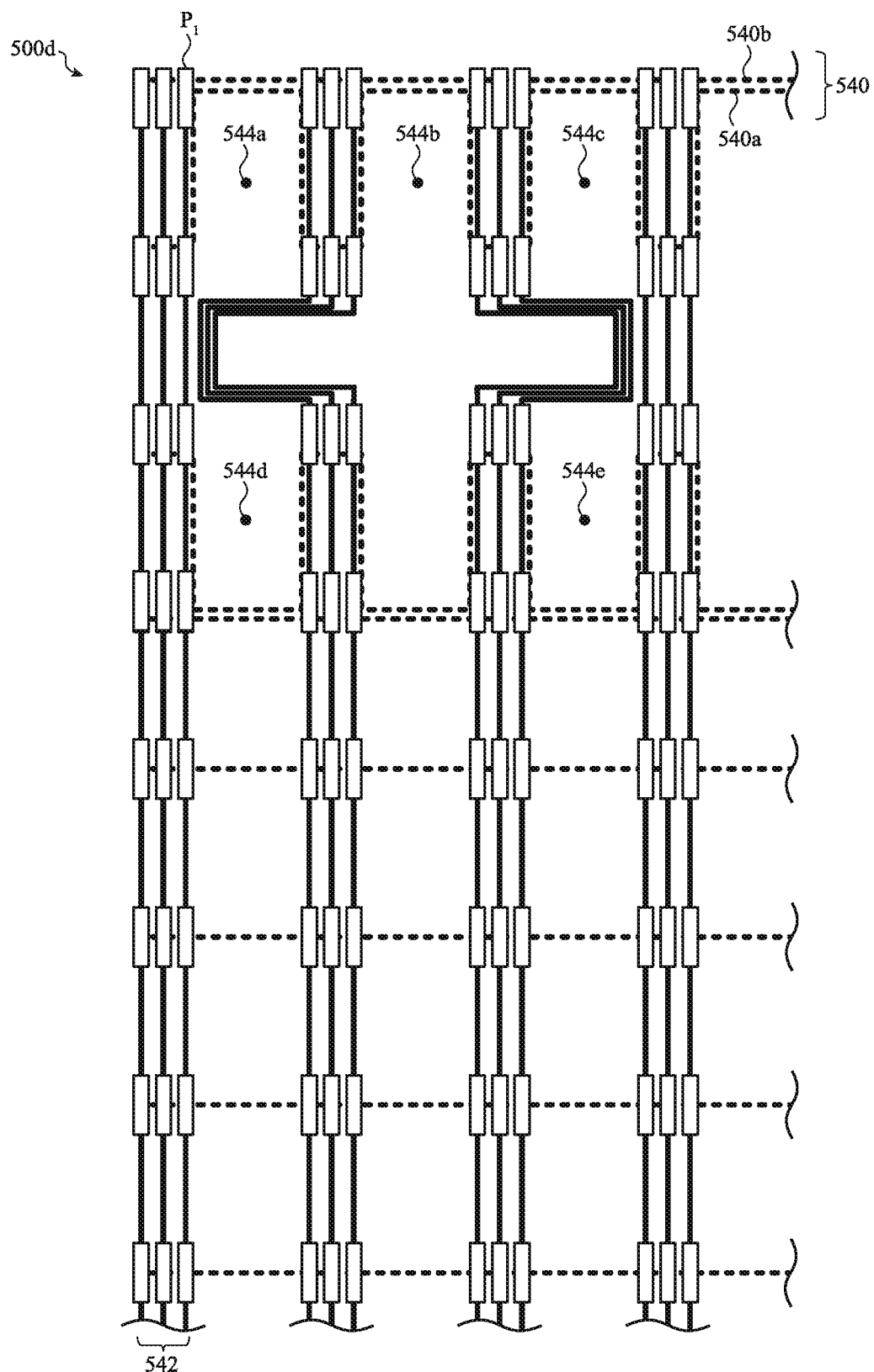
FIG. 5D depicts an example arrangement of subpixel drive lines of a display stack defining a region of increased inter-pixel transmittance.

Still some embodiments can locally increase optical transmittance of a display stack in a different manner. For example, in some embodiments, a thin-film transistor layer and/or a column-row addressing/trace layer of a display stack can be formed in a manner that locally increases inter-pixel regions and, in turn, increases optical transmittance of a display stack. FIG. 5D depicts an example arrangement of subpixel drive lines 500d of a display stack defining a region of increased inter-pixel optical transmittance. In particular, drive lines for each subpixel of an arrangement of subpixel groups can be shifted in a particular region of a display stack to increase the area of inter-pixel regions. For example, drive lines for a first and second row of subpixel groups—identified as the drive lines 540, including a first drive line 540a and a second drive line 540b—can be arranged in a non-grid pattern to define inter-pixel regions of increased area (e.g., inter-pixel regions 544a-544e). In this manner, the thin-film transistor layer and/or the column-row addressing/trace layer defines discrete regions of high optical transmissivity and regions of low optical transmissivity.

It may be appreciated that the foregoing description of FIGS. 3-5D, and various alternatives thereof and variations thereto are presented, generally, for purposes of explanation, and to facilitate a thorough understanding of various possible arrangements of pixels, subpixels, traces, and/or thin-film transistor structures of a display stack that can promote locally-increased optical transmittance through the display stack. However, it will be apparent to one skilled in the art that some of the specific details presented herein may not be required in order to practice a particular described embodiment, or an equivalent thereof.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings. Particularly, it is understood any suitable pixel, subpixel, trace, and/or thin-film transistor layout that promotes locally or globally increased optical transmittance may be possible. As noted above, these embodiments can be combined with embodiments described in reference to FIGS. 2A-2E in any suitable manner. For example, an imaging aperture such as shown in FIG. 2A can be positioned below and/or aligned with a low pixel-density region such as described in reference to FIGS. 3-5C and, additionally, can be positioned below and/or aligned with a thin-film transistor layer such as described in reference to FIG. 5D.

Figure 6A:
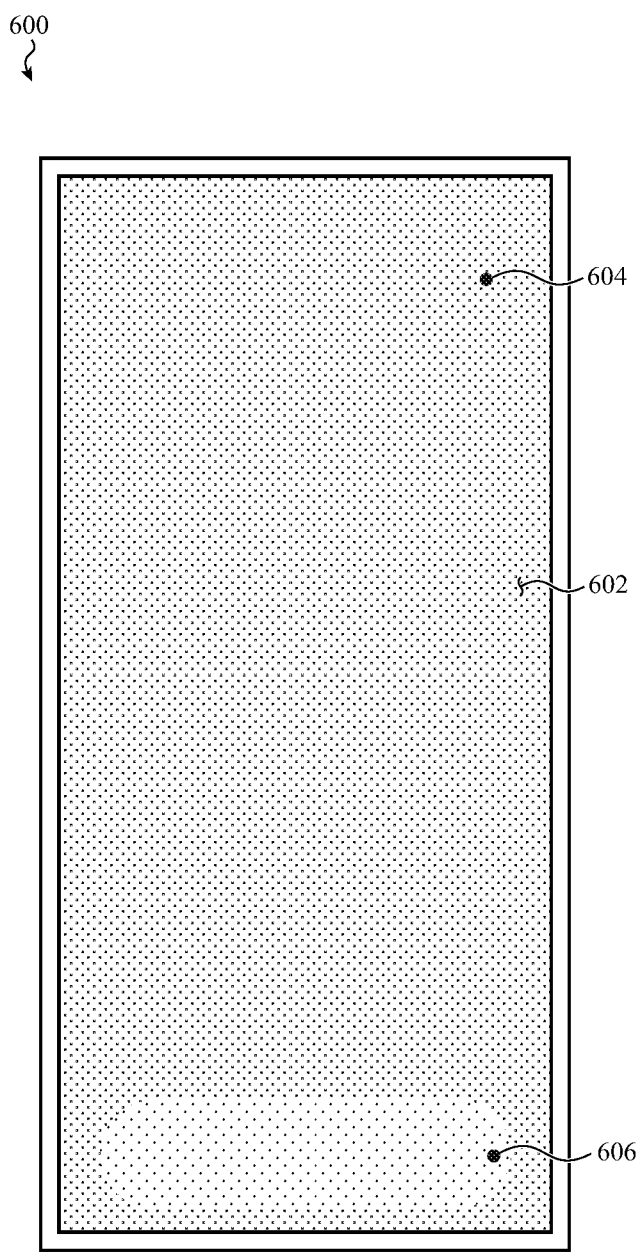
FIG. 6A depicts an electronic device incorporating a display stack with a locally-increased inter-pixel transmittance.

Similarly, it may be appreciated that regions of different pixel densities can be positioned anywhere within an electronic device display. For example, FIG. 6A depicts an electronic device 600 incorporating a display stack defining an active display area 602 that in turn defines a high pixel density region 604 and a low pixel density region 606. In one embodiment, the low pixel density region 606 is positioned above and aligned with an imaging aperture (see, e.g., FIG. 2A) that in turn is positioned above and aligned with an optical imaging array. In this example, when a user of the electronic device 600 touches the active display area 602 above the low pixel density region 606, the optical imaging array can image the user's fingerprint. The user's fingerprint can be imaged when the user's finger is stationary or moving. For example, in one embodiment, the user's fingerprint can be imaged when the user slides from one side of the low pixel density region 606 to another side of the low pixel density region 606. In another example, the user's fingerprint can be imaged when the user places his or her finger onto the low pixel density region.

In some cases, the active display area 602 can display an image or animation that encourages the user to touch a particular part of the low pixel density region 606 in order that the user's fingerprint can be captured. For example, in some embodiments, the active display area 602 can display a shape within the low pixel density region 606. The shape may be animated in a manner that draws the user's attention. For example, the shape can pulse, rotate in three dimensions, flash one or more colors, vibrate, and so on. In other cases, other shapes, patterns, or animations are possible.

In some examples, the electronic device 600 can generate one or more supplemental outputs in addition to, or in place of the operation of displaying an image or an animation described above. Supplemental outputs can include, but may not be limited to: playing a sound from a speaker; generating a haptic output with a vibrating element; generating a haptic tap or set of haptic pulses with a linear actuator; vibrating the display or housing; increasing or decreasing perceivable friction of the display (e.g., electrostatic attraction or ultrasonic vibration); and so on or any combination thereof.

Furthermore, in the illustrated embodiment, the low pixel density region 606 is entirely inset within the high pixel density region 604, but this may not be required. In the illustrated embodiment, the low pixel density region 606 has a capsule shape, but this may not be required. Further, in the illustrated embodiment, the electronic device 600 is depicted as a handheld portable electronic device (e.g., cell phone, tablet computer, portable media player, and so on), but this is not required of all embodiments.

Figure 6B:
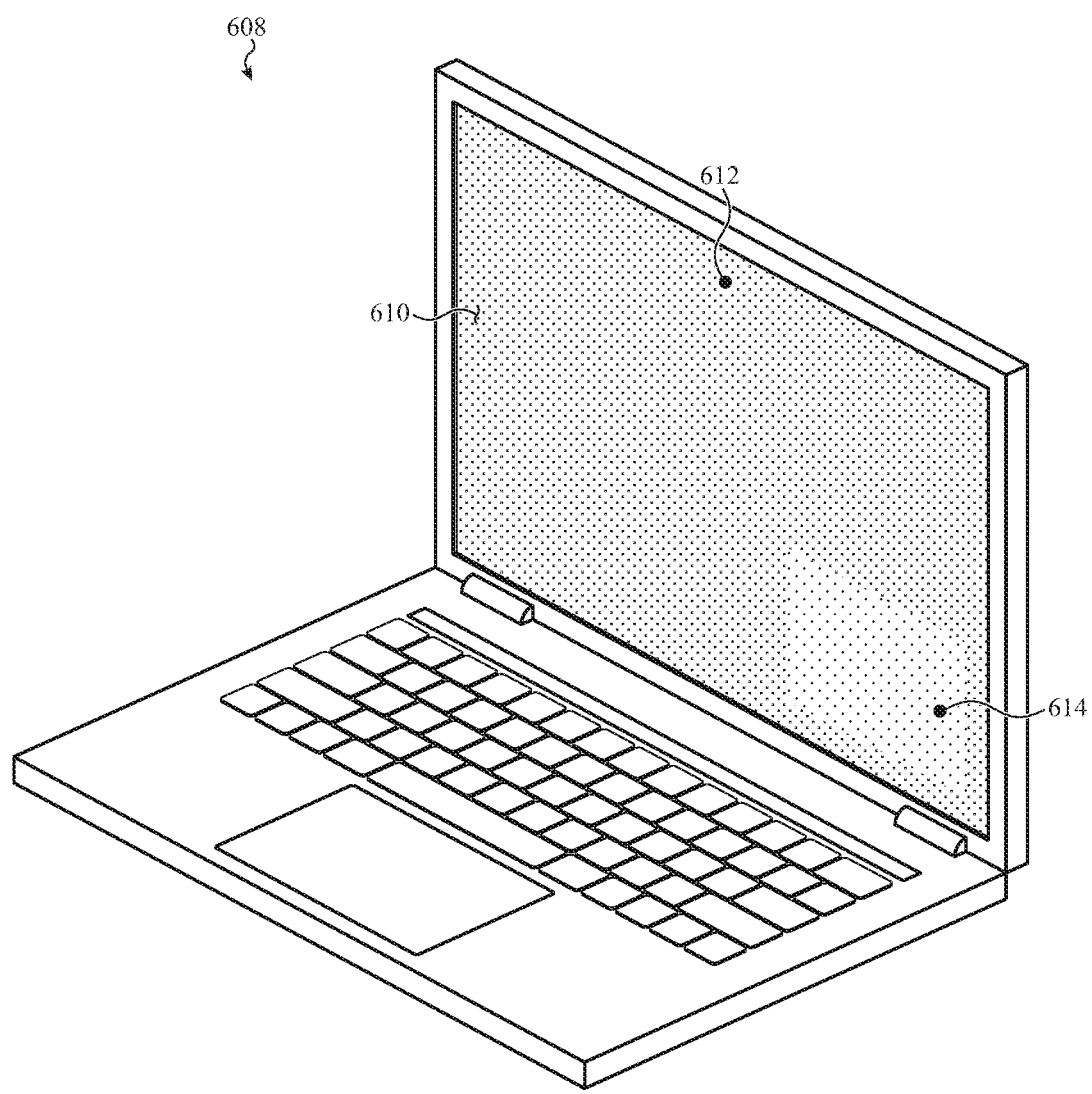
FIG. 6B depicts another electronic device incorporating a display stack with a locally-increased inter-pixel transmittance.

For example, FIG. 6B depicts another electronic device 608 incorporating a display stack with a locally-increased inter-pixel optical transmittance. In this example, a laptop computing device includes a primary display that defines an active display area 610 that defines a high pixel density region 612 and a low pixel density region 614. As with other embodiments described herein, when an imaging aperture and an optical imaging array can be positioned below the low pixel density region 614 in order to capture an image of a user's fingerprint when the user touches the active display area 610 within the low pixel density region 614.

Figure 6C:
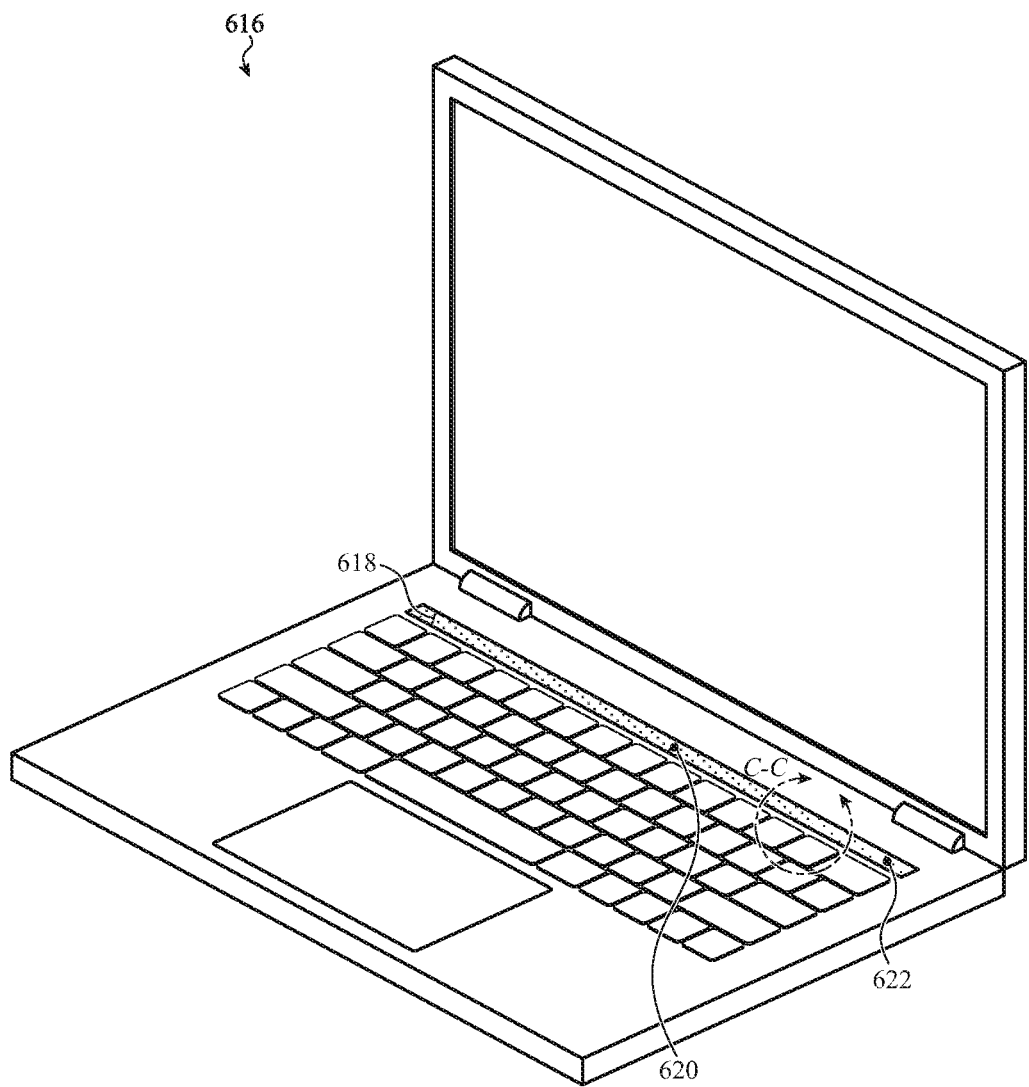
FIG. 6C depicts another electronic device incorporating a display stack with a locally-increased inter-pixel transmittance.
Figure 6D:
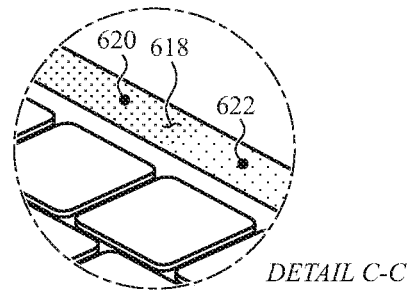
FIG. 6D depicts an enlarged detail view of the electronic device of FIG. 6C, enclosed within the circle C-C.

In other cases, a secondary display of an electronic device can additionally or alternatively include a high pixel density region and a low pixel density region. For example, FIGS. 6C-6D depict another electronic device 616 incorporating a display stack with a locally-increased inter-pixel optical transmittance. In this example, a secondary display of the electronic device 616 defines an active display area 618 that in turn defines a high pixel density region 620 and a low pixel density region 622. In this example, the low pixel density region 622 abuts the high pixel density region 620, disposed to one edge of the high pixel density region 620. In this embodiment, as with others described herein, the low pixel density region 622 can be positioned above an imaging aperture that in turn is positioned above an optical imaging array. As a result of this construction, an image of a fingerprint of a user can be captured when a user touches the low pixel density region 622.

Figure 7:
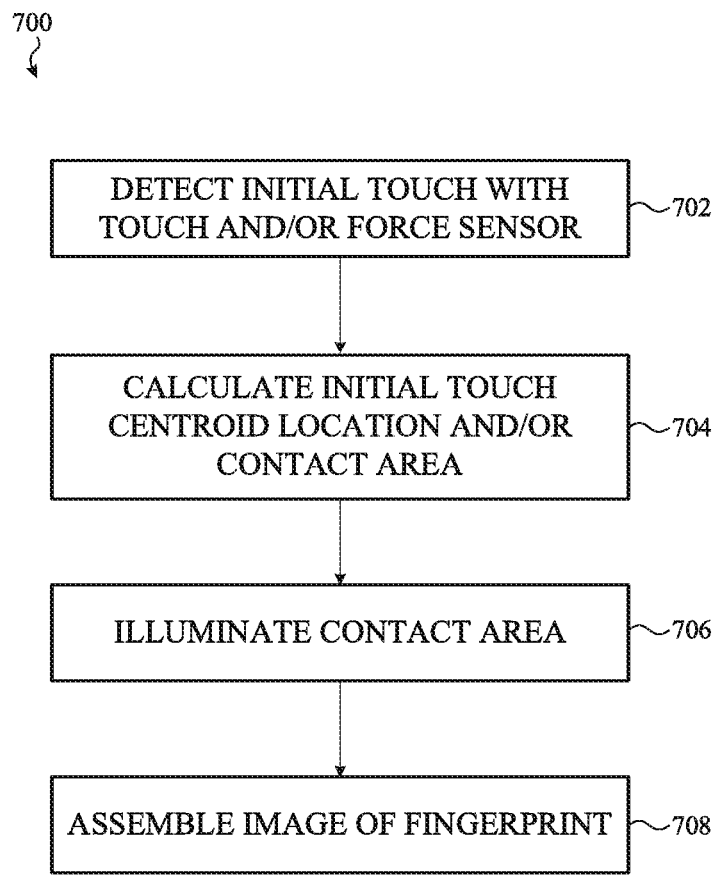
FIG. 7 is a simplified flow chart depicting example operations of a method of capturing an image of an object touching a display, such as described herein.
Figure 8:
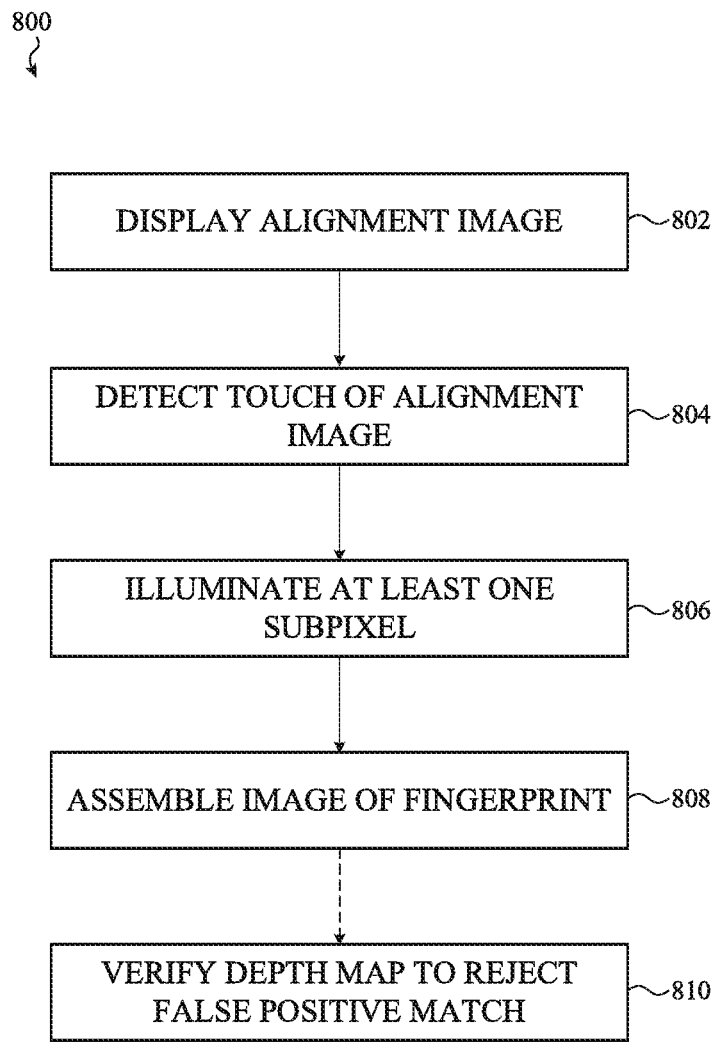
FIG. 8 is a simplified flow chart depicting example operations of a method of capturing an image of an object touching a display, such as described herein.

Generally and broadly, FIGS. 7 and 8 depict simplified flow charts corresponding to various ordered and/or unordered operations of methods described herein. It may be appreciated that these simplified examples may be modified in a variety of ways. In some examples, additional, alternative, or fewer operations than those depicted and described may be possible.

FIG. 7 is a simplified flow chart depicting example operations of a method of capturing an image of an object touching a display, such as described herein. The method can be performed, in whole or in part, by a processor or circuitry of an electronic device such as described herein (see, e.g., FIGS. 1A, 2A-2E, and so on).

The method 700 includes operation 702 in which a touch to a display of an electronic device is detected. The initial touch can be detected using any suitable sensor or combination of sensors including but not limited to touch sensors and force sensors. Example touch sensors include, but are not limited to: capacitive touch sensors; optical touch sensors; resistive touch sensors; acoustic touch sensors; and so on. Example force sensors include, but are not limited to: capacitive force sensors; resistive force sensors; piezoelectric force sensors; strain-based force sensors; inductive force sensors; and so on.

Once a touch is detected at operation 702, the method 700 continues to operation 704, in which a touch centroid is optionally determined. The centroid (e.g., geometric center) can be calculated, determined, or estimated using any suitable technique. In addition to determining the centroid of the touch, a total contact area can be determined.

The method 700 also includes operation 706 in which the determined centroid and/or contact area are illuminated by a display of the electronic device. As noted with respect to other embodiments described herein, the illumination of the contact centroid and/or contact area can be performed in any suitable manner including, but not limited to: a specific/selected color, sequence, or set of colors; a specific/selected modulation of light; a specific/selected animation pattern (e.g., linear sweep, radial sweep, radial expansion, and so on); non-visible spectrums of light (e.g., infrared, ultraviolet, and so on); and so on or any combination thereof.

The method 700 also includes operation 708 in which a fingerprint image is captured by an optical imaging array of the electronic device. As noted with respect to other embodiments described herein, the operation of capturing an image of a fingerprint (or, more generally, an image of whatever object touches the display at operation 702) can include one or more filtering operations such as: spatial filtering (e.g., point-source filtering, beam-forming, and so on); thresholding; deskewing; rotating; and so on.

FIG. 8 is a simplified flow chart depicting example operations of a method of capturing an image of an object touching a display, such as described herein. As with the method of FIG. 7, the method 800 can be performed, in whole or in part, by a processor or circuitry of an electronic device such as described herein (see, e.g., FIGS. 1A, 2A-2E, and so on).

The method 800 includes operation 802 in which an alignment image is displayed by a display of an electronic device. The alignment image can be any suitable animated or static image. Once the alignment image is shown, the method 800 progresses to operation 804 in which a touch of the alignment image is detected (e.g., via touch and/or force sensor). Thereafter, at operation 806, at least one subpixel of the display is illuminated below the region touched by a user. Thereafter, at operation 808, at least a partial image of a fingerprint of the user touching the display can be assembled. Optionally, at operation 810, depth information obtained from one or more side-illumination operations (see, e.g., FIG. 2D) can be collected to determine whether a false positive fingerprint match should be rejected. In particular, based on absence of depth information, the electronic device can reject a positive fingerprint match.

One may appreciate that although many embodiments are disclosed above, that the operations and steps presented with respect to methods and techniques described herein are meant as exemplary and accordingly are not exhaustive. One may further appreciate that alternate step order or, fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

Further, the present disclosure recognizes that personal information data, including biometric data, in the present technology, can be used to the benefit of users. For example, the use of biometric authentication data can be used for convenient access to device features without the use of passwords. In other examples, user biometric data is collected for providing users with feedback about their health or fitness levels. Further, other uses for personal information data, including biometric data, that benefit the user are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. For example, personal information from users should be collected for legitimate and reasonable uses of the entity and not shared or sold outside of those legitimate uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data, including biometric data. That is, the present disclosure contemplates that hardware and/or software elements can be provided to prevent or block access to such personal information data. For example, in the case of biometric authentication methods, the present technology can be configured to allow users to optionally bypass biometric authentication steps by providing secure information such as passwords, personal identification numbers, touch gestures, or other authentication methods, alone or in combination, known to those of skill in the art. In another example, users can select to remove, disable, or restrict access to certain health-related applications collecting users' personal health or fitness data.

What is claimed is:

1. An electronic device comprising:
   a display defining an active display area comprising:
   a first pixel region having light emitting pixels with a first pixel density; and
   a second pixel region, offset from the first pixel region, having light emitting pixels with a second pixel density;
   an opaque backing below the display and defining an aperture below the second pixel region; and
   an optical imaging array below the aperture configured to receive light reflected from a touch input provided above the second pixel region that is transmitted through the display between two or more pixels of the second pixel region;
   a first area included within the first pixel region has a first number of light emitting pixels;
   a second area, having a same size as the first area and included within the second pixel region, has a second number of light emitting pixels; and
   the first number of light emitting pixels is different than the second number of light emitting pixels.

2. The electronic device of claim 1, further comprising a transparent substrate positioned above the active display area and configured to receive the touch input.

3. The electronic device of claim 1, wherein the second pixel density is less than the first pixel density by a factor of at least two.

4. The electronic device of claim 1, wherein the first pixel density is associated with a first subpixel distribution pattern and the second pixel density is associated with a second subpixel distribution pattern.

5. The electronic device of claim 1, wherein pixels of the first pixel region and the second pixel region are formed from organic light-emitting diodes.

6. The electronic device of claim 1, comprising a lens positioned between the aperture defined by the opaque backing and the optical imaging array, the lens configured to focus the received reflected light onto the optical imaging array.

7. The electronic device of claim 6, wherein the optical imaging array comprises a complementary metal oxide semiconductor imaging sensor.

8. The electronic device of claim 1, wherein the aperture is a first aperture that is a member of an array of apertures defined in the opaque backing.

9. The electronic device of claim 8, wherein each aperture of the array of apertures is a pinhole lens operative to filter a separate portion of the received reflected light onto a respective separate portion of the optical imaging array.

10. The electronic device of claim 1, further comprising a narrow field-of-view filter positioned above the optical imaging array.

11. The electronic device of claim 10, further comprising an infrared cut filter positioned above the optical imaging array.

12. The electronic device of claim 11, wherein the infrared cut filter is positioned above the narrow field-of-view filter.

13. The electronic device of claim 10, wherein the narrow field-of-view filter is adhered to the display within the aperture with an optically-clear adhesive.

14. An electronic device comprising:
a housing;
a transparent substrate defining an exterior surface of the housing;
a display within the housing and below the transparent substrate defining an active display area with a high optical transmissivity region and a low optical transmissivity region offset from the high optical transmissivity region, the display comprising;
a first area included within the low optical transmissivity region and having a first number of light emitting pixels; and
a second area, having a same size as the first area and included within the high optical transmissivity region, and having a second number of light emitting pixels;
wherein the first number of light emitting pixels is different than the second number of light emitting pixels;
a backing coupled to the display and defining an aperture below the high optical transmissivity region; and
an optical imaging array optically coupled to the high transmissivity region within the aperture, the optical imaging array configured to receive light transmitted through the transparent substrate and the high optical transmissivity region of the display.

15. The electronic device of claim 14, wherein:
the transparent substrate is a first transparent substrate; and
the display comprises:
a second transparent substrate;
an array of organic light-emitting diodes disposed onto the second transparent substrate.

16. The electronic device of claim 14, wherein:
the transparent substrate is a first transparent substrate; and
the display comprises:
a second transparent substrate;
a thin-film transistor layer defining:
a first region of circuit traces disposed at a first density to at least partially define the low optical transmissivity region; and
a second region of circuit traces disposed at a second density to at least partially define the high optical transmissivity region.

17. The electronic device of claim 14, wherein the transmitted light received through the transparent substrate and the high optical transmissivity region of the display is emitted by a subset of pixels of the display and reflected from an object touching the transparent substrate above the high optical transmissivity region.

18. The electronic device of claim 17, wherein the emitted light comprises at least one of blue light or green light.

19. The electronic device of claim 17, wherein the subset of pixels is selected, at least in part, in response to an output received from a touch and/or force input sensor positioned between the transparent substrate and above the display.

20. An electronic device display comprising:
a transparent substrate;
an array of organic light-emitting diodes disposed onto the transparent substrate and defining an array of subpixel groups, wherein a first subpixel group has a first pixel density and a second subpixel group has a second pixel density, and the second subpixel group is offset from the first subpixel group, each subpixel group comprising:
a red subpixel;
a blue subpixel; and
a green subpixel;
an array of optical sensors, each optical sensor disposed adjacent to a selected blue or a selected green subpixel and comprising:
a collimating optical filter; and
a phototransistor below the collimating optical filter; and
an encapsulation layer disposed onto the transparent substrate and over the array of organic light-emitting diodes and the array of optical sensors; wherein,
a first area included within the first subpixel group has a first number of light emitting pixels;
a second area, having a same size as the first area and included within the second subpixel group, has a second number of light emitting pixels; and
the first number of light emitting pixels is different than the second number of light emitting pixels.

21. The electronic device display of claim 20, wherein the array of optical sensors is configured to capture light directed toward the display and oriented normal to the transparent substrate.

22. The electronic device display of claim 20, wherein the array of optical sensors is configured to capture light directed toward the display and oriented at an angle relative to the transparent substrate.

* * * * *